United States Patent
Li et al.

(10) Patent No.: US 7,508,721 B2
(45) Date of Patent: Mar. 24, 2009

(54) USE OF DATA LATCHES IN MULTI-PHASE PROGRAMMING OF NON-VOLATILE MEMORIES

(75) Inventors: Yan Li, Milpitas, CA (US); Raul-Adrian Cernea, Santa Clara, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/566,583

(22) Filed: Dec. 4, 2006

(65) Prior Publication Data

US 2007/0097744 A1 May 3, 2007

Related U.S. Application Data

(63) Continuation of application No. 11/097,517, filed on Apr. 1, 2005, now Pat. No. 7,158,421.

(51) Int. Cl.
*G11C 7/10* (2006.01)

(52) U.S. Cl. .................. 365/189.011; 365/185.01; 365/185.21; 365/189.05; 365/220

(58) Field of Classification Search ............ 365/189.01, 365/185.01, 185.21, 189.05, 189.08, 220, 365/189.011
See application file for complete search history.

(56) References Cited

U.S. PATENT DOCUMENTS

| | | | |
|---|---|---|---|
| 4,357,685 A | 11/1982 | Daniele et al. | |
| 4,785,427 A | 11/1988 | Young | |
| 5,034,922 A | 7/1991 | Burgess | |
| 5,070,032 A | 12/1991 | Yuan et al. | |
| 5,093,806 A | 3/1992 | Tran | |
| 5,095,344 A | 3/1992 | Harari | |
| 5,172,338 A | 12/1992 | Mehrotra et al. | |
| 5,245,571 A | 9/1993 | Takahashi | |
| 5,313,421 A | 5/1994 | Guterman et al. | |
| 5,315,541 A | 5/1994 | Harari et al. | |
| 5,343,063 A | 8/1994 | Yuan et al. | |
| 5,418,752 A | 5/1995 | Harari et al. | |

(Continued)

FOREIGN PATENT DOCUMENTS

EP    0 615 184    9/1994

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner*—Tuan T Nguyen
*Assistant Examiner*—Toan Le
(74) *Attorney, Agent, or Firm*—Davis Wright Tremaine LLP

(57) ABSTRACT

A non-volatile memory device includes circuitry for governing a multi-phase programming process in a non-volatile memory. The exemplary embodiment uses a quick pass write technique where a single programming pass is used, but the biasing of the selected memory cells is altered to slow programming as the memory cells approach their target values by raising the voltage level of the channels of the selected memory cells. A principle aspect of the present invention introduces a latch associated with the read/write circuitry connectable to each selected memory cell along a corresponding bit line for the storage of the result of the verify at this lower level.

17 Claims, 19 Drawing Sheets

U.S. PATENT DOCUMENTS

| | | | |
|---|---|---|---|
| 5,509,134 A | 4/1996 | Fandrich et al. | |
| 5,519,847 A | 5/1996 | Fandrich et al. | |
| 5,532,962 A | 7/1996 | Auclair et al. | |
| 5,537,356 A | 7/1996 | Akaogi et al. | |
| 5,570,315 A | 10/1996 | Tanaka et al. | |
| 5,595,924 A | 1/1997 | Yuan et al. | |
| 5,661,053 A | 8/1997 | Yuan | |
| 5,692,165 A | 11/1997 | Jeddeloh et al. | |
| 5,768,192 A | 6/1998 | Eitan | |
| 5,774,397 A | 6/1998 | Endoh et al. | |
| 5,815,444 A | 9/1998 | Ohta | |
| 5,860,082 A | 1/1999 | Smith et al. | |
| 5,862,099 A | 1/1999 | Gannage et al. | |
| 5,867,429 A | 2/1999 | Chen et al. | |
| 5,872,739 A | 2/1999 | Womack | |
| 5,893,135 A | 4/1999 | Hasbun et al. | |
| 5,903,495 A | 5/1999 | Takeuchi et al. | |
| 5,920,502 A | 7/1999 | Noda et al. | |
| 5,949,720 A | 9/1999 | Brady | |
| 5,969,986 A | 10/1999 | Wong et al. | |
| 6,011,287 A | 1/2000 | Itoh et al. | |
| 6,011,725 A | 1/2000 | Eitan | |
| 6,029,233 A | 2/2000 | Abily et al. | |
| 6,038,174 A | 3/2000 | Khan et al. | |
| 6,046,935 A | 4/2000 | Takeuchi et al. | |
| 6,046,940 A | 4/2000 | Takeuchi et al. | |
| 6,097,638 A | 8/2000 | Himeno et al. | |
| 6,128,229 A * | 10/2000 | Nobukata ............... | 365/185.22 |
| 6,222,762 B1 | 4/2001 | Guterman et al. | |
| 6,252,803 B1 | 6/2001 | Fastow et al. | |
| 6,253,250 B1 | 6/2001 | Evans et al. | |
| 6,266,273 B1 | 7/2001 | Conley et al. | |
| 6,324,121 B2 | 11/2001 | Banks | |
| 6,349,056 B1 | 2/2002 | Conley et al. | |
| 6,356,485 B1 | 3/2002 | Proebsting | |
| 6,373,746 B1 | 4/2002 | Takeuchi et al. | |
| 6,407,953 B1 | 6/2002 | Cleeves | |
| 6,438,038 B2 | 8/2002 | Ikehashi et al. | |
| 6,456,528 B1 | 9/2002 | Chen | |
| 6,490,199 B2 | 12/2002 | Lee et al. | |
| 6,504,757 B1 | 1/2003 | Hollmer et al. | |
| 6,519,180 B2 | 2/2003 | Tran et al. | |
| 6,560,143 B2 | 5/2003 | Conley et al. | |
| 6,650,570 B2 | 11/2003 | Tanzawa et al. | |
| 6,657,891 B1 | 12/2003 | Shibata et al. | |
| 6,687,158 B2 | 2/2004 | Yano | |
| 6,700,820 B2 | 3/2004 | Elmhurst et al. | |
| 6,717,857 B2 | 4/2004 | Byeon et al. | |
| 6,731,539 B1 | 5/2004 | Wong | |
| 6,738,289 B2 | 5/2004 | Gongwer | |
| 6,744,667 B2 | 6/2004 | Yamamoto et al. | |
| 6,829,167 B2 | 12/2004 | Tu et al. | |
| 6,829,172 B2 | 12/2004 | Bloom et al. | |
| 6,847,553 B2 | 1/2005 | Chen | |
| 6,856,568 B1 | 2/2005 | Wong | |
| 6,859,394 B2 | 2/2005 | Matsunaga et al. | |
| 6,940,753 B2 | 9/2005 | Cernea | |
| 6,972,993 B2 | 12/2005 | Conley et al. | |
| 6,983,428 B2 | 1/2006 | Cernea | |
| 6,987,693 B2 | 1/2006 | Cerenea et al. | |
| 6,992,936 B2 | 1/2006 | Tsujikawa et al. | |
| 6,999,344 B2 | 2/2006 | Hosono et al. | |
| 7,009,878 B2 | 3/2006 | Hosono et al. | |
| 7,012,835 B2 | 3/2006 | Gonzalez et al. | |
| 7,023,736 B2 | 4/2006 | Cernea et al. | |
| 7,038,946 B2 | 5/2006 | Hosono et al. | |
| 7,046,568 B2 | 5/2006 | Cernea | |
| 7,073,103 B2 | 7/2006 | Gongwer et al. | |
| 7,120,051 B2 | 10/2006 | Gorobets | |
| 7,158,421 B2 * | 1/2007 | Li et al. ................. | 365/189.01 |
| 7,177,197 B2 | 2/2007 | Cernea | |
| 7,187,585 B2 | 3/2007 | Li et al. | |
| 7,196,931 B2 | 3/2007 | Cernea et al. | |
| 7,206,230 B2 | 4/2007 | Li et al. | |
| 7,224,614 B1 | 5/2007 | Chan | |
| 7,251,160 B2 | 7/2007 | Li et al. | |
| 7,301,805 B2 | 11/2007 | Gorobets et al. | |
| 7,301,808 B2 | 11/2007 | Li et al. | |
| 7,301,816 B2 | 11/2007 | Li et al. | |
| 7,301,839 B2 | 11/2007 | Li et al. | |
| 7,321,510 B2 | 1/2008 | Li et al. | |
| 2001/0006477 A1 | 7/2001 | Banks | |
| 2001/0006479 A1 | 7/2001 | Ikehashi et al. | |
| 2001/0040826 A1 | 11/2001 | Lakhani | |
| 2002/0036925 A1 | 3/2002 | Tanzawa et al. | |
| 2002/0039322 A1 | 4/2002 | Tran et al. | |
| 2002/0118574 A1 | 8/2002 | Gongwer et al. | |
| 2002/0126528 A1 | 9/2002 | Conley et al. | |
| 2002/0126532 A1 | 9/2002 | Matsunaga et al. | |
| 2003/0072192 A1 | 4/2003 | Bloom et al. | |
| 2003/0117850 A1 | 6/2003 | Yano | |
| 2003/0123295 A1 | 7/2003 | Elmhurst et al. | |
| 2003/0137888 A1 | 7/2003 | Chen et al. | |
| 2003/0174555 A1 | 9/2003 | Conley et al. | |
| 2004/0057285 A1 | 3/2004 | Cernea et al. | |
| 2004/0057287 A1 | 3/2004 | Cernea et al. | |
| 2004/0057318 A1 | 3/2004 | Cernea et al. | |
| 2004/0060031 A1 | 3/2004 | Cernea | |
| 2004/0109357 A1 | 6/2004 | Cernea et al. | |
| 2004/0109362 A1 | 6/2004 | Gongwer et al. | |
| 2004/0160829 A1 | 8/2004 | Tsujikawa et al. | |
| 2004/0210729 A1 | 10/2004 | Horii et al. | |
| 2004/0237000 A1 | 11/2004 | Keays | |
| 2004/0240269 A1 | 12/2004 | Cernea | |
| 2005/0047217 A1 | 3/2005 | Shibata et al. | |
| 2005/0157560 A1 | 7/2005 | Hosono et al. | |
| 2005/0169057 A1 | 8/2005 | Shibata et al. | |
| 2005/0169082 A1 | 8/2005 | Cernea | |
| 2005/0257120 A1 | 11/2005 | Gorobets et al. | |
| 2006/0031593 A1 | 2/2006 | Sinclair | |
| 2006/0126393 A1 | 6/2006 | Li et al. | |
| 2006/0126394 A1 | 6/2006 | Li | |
| 2006/0136687 A1 | 6/2006 | Conley et al. | |
| 2006/0140007 A1 | 6/2006 | Cernea et al. | |
| 2006/0221692 A1 | 10/2006 | Chen | |
| 2006/0221696 A1 | 10/2006 | Li | |
| 2006/0221697 A1 | 10/2006 | Li et al. | |
| 2006/0221704 A1 | 10/2006 | Li et al. | |
| 2006/0233010 A1 | 10/2006 | Li | |
| 2006/0233021 A1 | 10/2006 | Li et al. | |
| 2006/0233022 A1 | 10/2006 | Li | |
| 2006/0233023 A1 | 10/2006 | Li et al. | |
| 2006/0233026 A1 | 10/2006 | Li | |
| 2006/0239080 A1 | 10/2006 | Li | |
| 2007/0002626 A1 | 1/2007 | Li | |
| 2007/0103982 A1 | 5/2007 | Li et al. | |
| 2007/0109846 A1 | 5/2007 | Li et al. | |
| 2007/0109867 A1 | 5/2007 | Li et al. | |

FOREIGN PATENT DOCUMENTS

| | | |
|---|---|---|
| EP | 1134746 A2 | 9/2001 |
| EP | 1164595 A | 12/2001 |
| EP | 1 209 568 A1 | 5/2002 |
| EP | 1280161 A1 | 1/2003 |
| EP | 1 473 737 A1 | 11/2004 |
| JP | 5282883 | 3/1992 |
| JP | 11003290 | 1/1999 |
| WO | WO 98/44420 | 10/1998 |
| WO | WO 00/49488 | 8/2000 |
| WO | WO 00/67137 | 11/2000 |
| WO | WO 02/49039 | 6/2002 |
| WO | WO 02/058074 | 7/2002 |
| WO | WO 02/069340 | 9/2002 |

| WO | WO 03/029951 | 4/2003 |
| WO | WO 03/069627 | 8/2003 |
| WO | WO 2006/107654 | 10/2006 |
| WO | WO 2007/130976 | 11/2007 |
| WO | WO 2007/131059 | 11/2007 |
| WO | WO 2007/131602 | 11/2007 |

OTHER PUBLICATIONS

International Search Report corresponding to PCT/US03/30133, International Searching Authority, European Patent Office, filed Sep. 18, 2003, 4 pages.

EPO/ISA, "Notification of Transmittal of the International Search Report or the Declaration", mailed in PCT/US03/29603 Nov. 5, 2004, 7 pages.

"Communication Relating to the Results of the Partial International Search" in PCT/US03/29603, EPO International Searching Authority, Jul. 30, 2004, 2 pages.

European Patent Office (International Searching Authority), "Notification of Transmittal of the International Search Report or the Declaration", issued in corresponding PCT Application No. PCT/US03/29045, Jul. 28, 2004, 6 pages.

ISA/European Patent Office, "Notification of Transmittal of the International Search Report and the Written Opinion of the International Searching Authority, or the Declaration", mailed in related PCT/US2004/029426 on Jan. 20, 2005, 12 pages.

Notification of Transmittal of the International Search Report and the Written Opinion of the International Searching Authority, or the Declaration for International Application No. PCT/US2005/016341 mailed Oct. 19, 2005, 12 pages.

EPO/ISA, "Notification of Transmittal of the International Search Report and the Written Opinion of the International Searching Authority, or the Declaration," mailed in the International Application No. PCT/US2006/011032 on Jul. 20, 2006, 9 pages.

Notification of Transmittal of the International Search Report and the Written Opinion of the International Searching Authority, or the Declaration for International Application No. PCT.US2006/011248 for SanDisk Corporation, mailed Jul. 24, 2006, 11 pages.

Imamiya et al., "A 125-mm2 1-Gb NAND Flash Memory with 10/Mbytes/s Program Speed," IEEE Journal of Solid-State Circuits, vol. 37, No. 11, Nov. 2002, pp. 1493-1501.

Lee et al., "High-Performance 1-Gb NAND Flash Memory with 0.12-µm Technology," Journal of Solid-State Circuits, Nov. 2002, vol. 37, No. 11, pp. 1502-1509.

Nakamura et al., "A Novel Sense Amplifier for Flexible Voltage Operation NAND Flash Memories," 1995 Symposium on VLSI Circuits Digest of Technical Papers, Jun. 8-10, 1995, pp. 71-72.

Srisa-an et al., "Performance Enhancements to the Active Memory System," 2002 IEEE International Conference on Computer Design: VLSI in Computers and Processors, Sep. 16-18, 2002, pp. 249-256.

Office Action for European Application No. 06 739 682.0 dated Jan. 18, 2008, 1 page.

Communication Pursuant to Article 94(3) EPC, Application No. 06 739 812.3, dated Mar. 17, 2008, 24 pages.

* cited by examiner

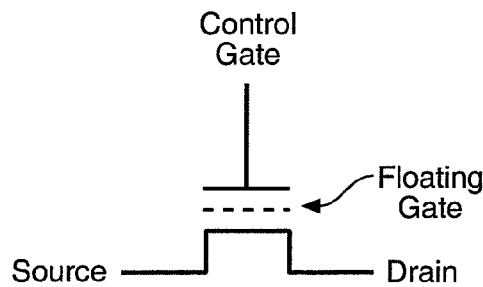
FIG. 1A *(PRIOR ART)*
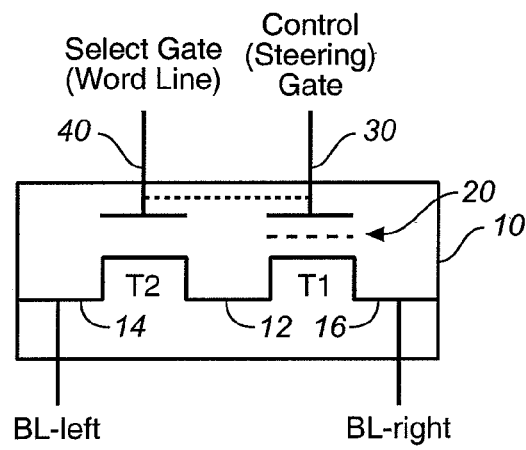
FIG. 1B *(PRIOR ART)*
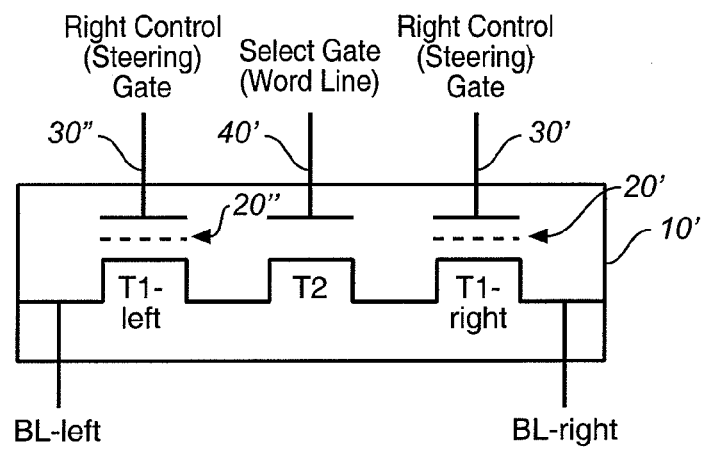
FIG. 1C *(PRIOR ART)*

FIG. 3 *(PRIOR ART)*

Input Logic Truth Table

| Transfer Mode | ONE | ONEB<0> | ONEB<1> | PBus (Input) | BSI (Output) |
|---|---|---|---|---|---|
| Pass-Through | 1 | 0 | 0 | PBus | PBus |
| Invert | 0 | 1 | 1 | PBus | PBus* |
| Float | 1 | 1 | 0 | PBus | Float |

Output Logic Truth Table

| Transfer Mode | PINV | NINV | PDIR | NDIR | MTCH | PBus (Output) |
|---|---|---|---|---|---|---|
| Pass-Through | D | D | D | 1 | 0 | 0 |
|  | 0 | D | D | D | 1 | 1 |
| Invert | D | D | 0 | D | 0 | 1 |
|  | D | 1 | D | D | 1 | 0 |
| Float | D | D | D | D | X | Z |
| Pre-Charge | 0 | D | 0 | D | X | 1 |

(Default Values: PINV=1, NINV=0, PDIR=1, NDIR=0)

USE OF DATA LATCHES IN MULTI-PHASE PROGRAMMING OF NON-VOLATILE MEMORIES

CROSS REFERENCE TO RELATED APPLICATIONS

This application is a continuation of Ser. No. 11/097,517, filed Apr. 1, 2005 now U.S. Pat. No. 7,158,421, which is related to the following U.S. patent applications: Ser. No. 11/013,125, filed Dec. 14, 2004; Ser. No. 11/026,536, filed Dec. 29, 2004; Ser. No. 11/015,199, filed Dec. 16, 2004; a patent application entitled "Non-Volatile Memory and Method with Power-Saving Read and Program-Verify Operations", by Yan Li, Seungpil Lee, and Siu Lung Chan, filed Mar. 16, 2005; and a patent application entitled "Use of Data Latches in Cache Operations of Non-Volatile Memories", by Yan Li and Emilio Yero, filed concurrently with the present application. These applications are incorporated herein by reference in their entirety for all purposes.

FIELD OF THE INVENTION

This invention relates generally to non-volatile semiconductor memory such as electrically erasable programmable read-only memory (EEPROM) and flash EEPROM, and specifically to methods of implementing quick pass write or other multi-phase programming techniques.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, retaining its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

Examples of Non-Volatile Memory Cells

The memory devices typically comprise one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing. There are many commercially successful non-volatile solid-state memory devices being used today. These memory devices may employ different types of memory cells, each type having one or more charge storage element.

FIGS. 1A-1E illustrate schematically different examples of non-volatile memory cells.

FIG. 1A illustrates schematically a non-volatile memory in the form of an EEPROM cell with a floating gate for storing charge. An electrically erasable and programmable read-only memory (EEPROM) has a similar structure to EPROM, but additionally provides a mechanism for loading and removing charge electrically from its floating gate upon application of proper voltages without the need for exposure to UV radiation. Examples of such cells and methods of manufacturing them are given in U.S. Pat. No. 5,595,924.

FIG. 1B illustrates schematically a flash EEPROM cell having both a select gate and a control or steering gate. The memory cell 10 has a "split-channel" 12 between source 14 and drain 16 diffusions. A cell is formed effectively with two transistors T1 and T2 in series. T1 serves as a memory transistor having a floating gate 20 and a control gate 30. The floating gate is capable of storing a selectable amount of charge. The amount of current that can flow through the T1's portion of the channel depends on the voltage on the control gate 30 and the amount of charge residing on the intervening floating gate 20. T2 serves as a select transistor having a select gate 40. When T2 is turned on by a voltage at the select gate 40, it allows the current in the T1's portion of the channel to pass between the source and drain. The select transistor provides a switch along the source-drain channel independent of the voltage at the control gate. One advantage is that it can be used to turn off those cells that are still conducting at zero control gate voltage due to their charge depletion (positive) at their floating gates. The other advantage is that it allows source side injection programming to be more easily implemented.

One simple embodiment of the split-channel memory cell is where the select gate and the control gate are connected to the same word line as indicated schematically by a dotted line shown in FIG. 1B. This is accomplished by having a charge storage element (floating gate) positioned over one portion of the channel and a control gate structure (which is part of a word line) positioned over the other channel portion as well as over the charge storage element. This effectively forms a cell with two transistors in series, one (the memory transistor) with a combination of the amount of charge on the charge storage element and the voltage on the word line controlling the amount of current that can flow through its portion of the channel, and the other (the select transistor) having the word line alone serving as its gate. Examples of such cells, their uses in memory systems and methods of manufacturing them are given in U.S. Pat. Nos. 5,070,032, 5,095,344, 5,315,541, 5,343,063, and 5,661,053.

A more refined embodiment of the split-channel cell shown in FIG. 1B is when the select gate and the control gate are independent and not connected by the dotted line between them. One implementation has the control gates of one column in an array of cells connected to a control (or steering) line perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the charge storage element to a desired level through an electric field (capacitive) coupling between the word line and the charge storage element. It is often difficult to perform both of these functions in an optimum manner with a single voltage. With the separate control of the control gate and the select gate, the word line need only perform function (1), while the added control line performs function (2). This capability allows for design of higher performance programming where the programming voltage is geared to the targeted data. The use of independent control (or steering) gates in a flash EEPROM array is described, for example, in U.S. Pat. Nos. 5,313,421 and 6,222,762.

FIG. 1C illustrates schematically another flash EEPROM cell having dual floating gates and independent select and control gates. The memory cell 10 is similar to that of FIG. 1B except it effectively has three transistors in series. In this type of cell, two storage elements (i.e., that of T1—left and T1—right) are included over its channel between source and drain diffusions with a select transistor T1 in between them. The memory transistors have floating gates 20 and 20', and control gates 30 and 30', respectively. The select transistor T2 is controlled by a select gate 40. At any one time, only one of the pair of memory transistors is accessed for read or write. When the storage unit T1—left is being accessed, both the T2 and T1—right are turned on to allow the current in the T1—left's portion of the channel to pass between the source and the drain. Similarly, when the storage unit T1—right is being accessed, T2 and T1—left are turned on. Erase is effected by having a portion of the select gate polysilicon in close proximity to the floating gate and applying a substantial positive voltage (e.g. 20V) to the select gate so that the electrons stored within the floating gate can tunnel to the select gate polysilicon.

FIG. 1D illustrates schematically a string of memory cells organized into an NAND cell. An NAND cell 50 consists of a series of memory transistors M1, M2, . . . Mn (n=4, 8, 16 or higher) daisy-chained by their sources and drains. A pair of select transistors S1, S2 controls the memory transistors chain's connection to the external via the NAND cell's source terminal 54 and drain terminal 56. In a memory array, when the source select transistor S1 is turned on, the source terminal is coupled to a source line. Similarly, when the drain select transistor S2 is turned on, the drain terminal of the NAND cell is coupled to a bit line of the memory array. Each memory transistor in the chain has a charge storage element to store a given amount of charge so as to represent an intended memory state. A control gate of each memory transistor provides control over read and write operations. A control gate of each of the select transistors S1, S2 provides control access to the NAND cell via its source terminal 54 and drain terminal 56 respectively.

When an addressed memory transistor within an NAND cell is read and verified during programming, its control gate is supplied with an appropriate voltage. At the same time, the rest of the non-addressed memory transistors in the NAND cell 50 are fully turned on by application of sufficient voltage on their control gates. In this way, a conductive path is effective created from the source of the individual memory transistor to the source terminal 54 of the NAND cell and likewise for the drain of the individual memory transistor to the drain terminal 56 of the cell. Memory devices with such NAND cell structures are described in U.S. Pat. Nos. 5,570,315, 5,903, 495, 6,046,935.

FIG. 1E illustrates schematically a non-volatile memory with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Memory Array

A memory device typically comprises of a two-dimensional array of memory cells arranged in rows and columns and addressable by word lines and bit lines. The array can be formed according to an NOR type or an NAND type architecture.

NOR Array

FIG. 2 illustrates an example of an NOR array of memory cells. Memory devices with an NOR type architecture have been implemented with cells of the type illustrated in FIGS. 1B or 1C. Each row of memory cells are connected by their sources and drains in a daisy-chain manner. This design is sometimes referred to as a virtual ground design. Each memory cell 10 has a source 14, a drain 16, a control gate 30 and a select gate 40. The cells in a row have their select gates connected to word line 42. The cells in a column have their sources and drains respectively connected to selected bit lines 34 and 36. In some embodiments where the memory cells have their control gate and select gate controlled independently, a steering line 36 also connects the control gates of the cells in a column.

Many flash EEPROM devices are implemented with memory cells where each is formed with its control gate and select gate connected together. In this case, there is no need for steering lines and a word line simply connects all the control gates and select gates of cells along each row. Examples of these designs are disclosed in U.S. Pat. Nos. 5,172,338 and 5,418,752. In these designs, the word line essentially performed two functions: row selection and supplying control gate voltage to all cells in the row for reading or programming.

NAND Array

FIG. 3 illustrates an example of an NAND array of memory cells, such as that shown in FIG. 1D. Along each column of NAND cells, a bit line is coupled to the drain terminal 56 of each NAND cell. Along each row of NAND cells, a source line may connect all their source terminals 54. Also the control gates of the NAND cells along a row are connected to a series of corresponding word lines. An entire row of NAND cells can be addressed by turning on the pair of select transistors (see FIG. 1D) with appropriate voltages on their control gates via the connected word lines. When a memory transistor within the chain of a NAND cell is being read, the remaining memory transistors in the chain are turned on hard via their associated word lines so that the current flowing through the chain is essentially dependent upon the level of charge stored in the cell being read. An example of an NAND architecture array and its operation as part of a memory system is found in U.S. Pat. Nos. 5,570,315, 5,774,397 and 6,046,935.

Block Erase

Programming of charge storage memory devices can only result in adding more charge to its charge storage elements. Therefore, prior to a program operation, existing charge in a charge storage element must be removed (or erased). Erase circuits (not shown) are provided to erase one or more blocks of memory cells. A non-volatile memory such as EEPROM is referred to as a "Flash" EEPROM when an entire array of cells, or significant groups of cells of the array, is electrically erased together (i.e., in a flash). Once erased, the group of cells can then be reprogrammed. The group of cells erasable together may consist one or more addressable erase unit. The erase unit or block typically stores one or more pages of data, the page being the unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in with it is stored.

Read/Write Circuits

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current $I_{REF}$). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

FIG. 4 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Six memory states may be demarcated by partitioning the threshold window into five regions in interval of 0.5V each. For example, if a reference current, $I_{REF}$ of 2 µA is used as shown, then the cell programmed with Q1 may be considered to be in a memory state "1" since its curve intersects with $I_{REF}$ in the region of the threshold window demarcated by $V_{CG}$=0.5V and 1.0V. Similarly, Q4 is in a memory state "5".

As can be seen from the description above, the more states a memory cell is made to store, the more finely divided is its threshold window. This will require higher precision in programming and reading operations in order to be able to achieve the required resolution.

U.S. Pat. No. 4,357,685 discloses a method of programming a 2-state EPROM in which when a cell is programmed to a given state, it is subject to successive programming voltage pulses, each time adding incremental charge to the floating gate. In between pulses, the cell is read back or verified to determine its source-drain current relative to the breakpoint level. Programming stops when the current state has been verified to reach the desired state. The programming pulse train used may have increasing period or amplitude.

Prior art programming circuits simply apply programming pulses to step through the threshold window from the erased or ground state until the target state is reached. Practically, to allow for adequate resolution, each partitioned or demarcated region would require at least about five programming steps to transverse. The performance is acceptable for 2-state memory cells. However, for multi-state cells, the number of steps required increases with the number of partitions and therefore, the programming precision or resolution must be increased. For example, a 16-state cell may require on average at least 40 programming pulses to program to a target state.

FIG. 5 illustrates schematically a memory device with a typical arrangement of a memory array 100 accessible by read/write circuits 170 via row decoder 130 and column decoder 160. As described in connection with FIGS. 2 and 3, a memory transistor of a memory cell in the memory array 100 is addressable via a set of selected word line(s) and bit line(s). The row decoder 130 selects one or more word lines and the column decoder 160 selects one or more bit lines in order to apply appropriate voltages to the respective gates of the addressed memory transistor. Read/write circuits 170 are provided to read or write (program) the memory states of addressed memory transistors. The read/write circuits 170 comprise a number of read/write modules connectable via bit lines to memory elements in the array.

FIG. 6A is a schematic block diagram of an individual read/write module 190. Essentially, during read or verify, a sense amplifier determines the current flowing through the drain of an addressed memory transistor connected via a selected bit line. The current depends on the charge stored in the memory transistor and its control gate voltage. For example, in a multi-state EEPROM cell, its floating gate can be charged to one of several different levels. For a 4-level cell, it may be used to store two bits of data. The level detected by the sense amplifier is converted by a level-to-bits conversion logic to a set of data bits to be stored in a data latch.

Factors Affecting Read/Write Performance and Accuracy

In order to improve read and program performance, multiple charge storage elements or memory transistors in an array are read or programmed in parallel. Thus, a logical "page" of memory elements are read or programmed together. In existing memory architectures, a row typically contains several interleaved pages. All memory elements of a page will be read or programmed together. The column decoder will selectively connect each one of the interleaved pages to a corresponding number of read/write modules. For example, in one implementation, the memory array is designed to have a page size of 532 bytes (512 bytes plus 20 bytes of overheads.) If each column contains a drain bit line and there are two interleaved pages per row, this amounts to 8512 columns with each page being associated with 4256 columns. There will be 4256 sense modules connectable to read or write in parallel either all the even bit lines or the odd bit lines. In this way, a page of 4256 bits (i.e., 532 bytes) of data in parallel are read from or programmed into the page of memory elements. The read/write modules forming the read/write circuits 170 can be arranged into various architectures.

Referring to FIG. 5, the read/write circuits 170 is organized into banks of read/write stacks 180. Each read/write stack 180 is a stack of read/write modules 190. In a memory array, the column spacing is determined by the size of the one or two transistors that occupy it. However, as can be seen from FIG. 6A, the circuitry of a read/write module will likely be implemented with many more transistors and circuit elements and therefore will occupy a space over many columns. In order to service more than one column among the occupied columns, multiple modules are stacked up on top of each other.

FIG. 6B shows the read/write stack of FIG. 5 implemented conventionally by a stack of read/write modules 190. For example, a read/write module may extend over sixteen columns, then a read/write stack 180 with a stack of eight read/write modules can be used to service eight columns in parallel. The read/write stack can be coupled via a column decoder to either the eight odd (1, 3, 5, 7, 9, 11, 13, 15) columns or the eight even (2, 4, 6, 8, 10, 12, 14, 16) columns among the bank.

As mentioned before, conventional memory devices improve read/write operations by operating in a massively parallel manner on all even or all odd bit lines at a time. This architecture of a row consisting of two interleaved pages will help to alleviate the problem of fitting the block of read/write circuits. It is also dictated by consideration of controlling bit-line to bit-line capacitive coupling. A block decoder is used to multiplex the set of read/write modules to either the even page or the odd page. In this way, whenever one set bit lines are being read or programmed, the interleaving set can be grounded to minimize immediate neighbor coupling.

However, the interleaving page architecture is disadvantageous in at least three respects. First, it requires additional multiplexing circuitry. Secondly, it is slow in performance. To finish read or program of memory cells connected by a word line or in a row, two read or two program operations are required. Thirdly, it is also not optimum in addressing other disturb effects such as field coupling between neighboring charge storage elements at the floating gate level when the two neighbors are programmed at different times, such as separately in odd and even pages.

The problem of neighboring field coupling becomes more pronounced with ever closer spacing between memory transistors. In a memory transistor, a charge storage element is sandwiched between a channel region and a control gate. The current that flows in the channel region is a function of the resultant electric field contributed by the field at the control gate and the charge storage element. With ever increasing density, memory transistors are formed closer and closer together. The field from neighboring charge elements then becomes significant contributor to the resultant field of an affected cell. The neighboring field depends on the charge programmed into the charge storage elements of the neighbors. This perturbing field is dynamic in nature as it changes with the programmed states of the neighbors. Thus, an affected cell may read differently at different time depending on the changing states of the neighbors.

The conventional architecture of interleaving page exacerbates the error caused by neighboring floating gate coupling. Since the even page and the odd page are programmed and read independently of each other, a page may be programmed under one set of condition but read back under an entirely different set of condition, depending on what has happened to the intervening page in the meantime. The read errors will become more severe with increasing density, requiring a more accurate read operation and coarser partitioning of the threshold window for multi-state implementation. Performance will suffer and the potential capacity in a multi-state implementation is limited.

U.S. Patent Publication No. US-2004-0060031-A1 discloses a high performance yet compact non-volatile memory device having a large block of read/write circuits to read and write a corresponding block of memory cells in parallel. In particular, the memory device has an architecture that reduces redundancy in the block of read/write circuits to a minimum.

Significant saving in space as well as power is accomplished by redistributing the block of read/write modules into a block read/write module core portions that operate in parallel while interacting with a substantially smaller sets of common portions in a time-multiplexing manner. In particular, data processing among read/write circuits between a plurality of sense amplifiers and data latches is performed by a shared processor.

Therefore there is a general need for high performance and high capacity non-volatile memory. In particular, there is a need for a compact non-volatile memory with enhanced read and program performance having an improved processor that is compact and efficient, yet highly versatile for processing data among the read/writing circuits.

SUMMARY OF INVENTION

According to one aspect of the invention, provides a method and corresponding circuitry for governing a multi-phase programming process in a non-volatile memory. More specifically, the exemplary embodiment uses a quick pass write technique where a single programming pass is used, but the biasing of the selected memory cells is altered to slow programming as the memory cells approach their target values. After each programming pulse, the memory is verified at a first, lower verify value, followed by a second verify at a second higher level. The second level is used to lock out a selected cell from further programming. The first, lower verify level is used to change the programming phase. In the exemplary embodiment, raising the voltage level of the channels of the selected memory cells does this. A principle aspect of the present invention introduces a latch associated with the read/write circuitry connectable to each selected memory cell along a corresponding bit line for the storage of the result of the verify at this lower level. In an N state memory, each memory cell selected for programming will have associated with it N+1 latches, N latches to keep track of the target data and an (N+1)st latch for governing the programming phase.

The exemplary embodiment is a memory of the NAND-type, specifically in an all bit line architecture. A programming waveform of a rising staircase form is applied along a selected word line. In the initial programming phase, the selected memory cells have their channels set to ground, by setting their corresponding bit lines to ground, in order to facilitate programming. Once there is a successful verify at the lower verify level, the bit line voltage is raised, in the exemplary embodiment through the level on a set of bit line clamps, so that the channels of the selected memory cells are allowed to come up to a higher voltage level, thereby slowing programming. The exemplary embodiment utilizes a bit line clamp to adjust the bias level on the bit lines. The read/write stack associated with each bit line has a set of data latches usable to govern the write process, with one of these latches used to store the result of the verify at the lower level and thereby govern the programming phase, as well as sufficient latches to monitor the standard programming process.

Additional features and advantages of the present invention will be understood from the following description of its preferred embodiments, which description should be taken in conjunction with the accompanying drawings.

BRIEF DESCRIPTION OF THE DRAWINGS

FIGS. 1A-1E illustrate schematically different examples of non-volatile memory cells.

DETAILED DESCRIPTION OF THE PREFERRED EMBODIMENTS

Figure 1D:
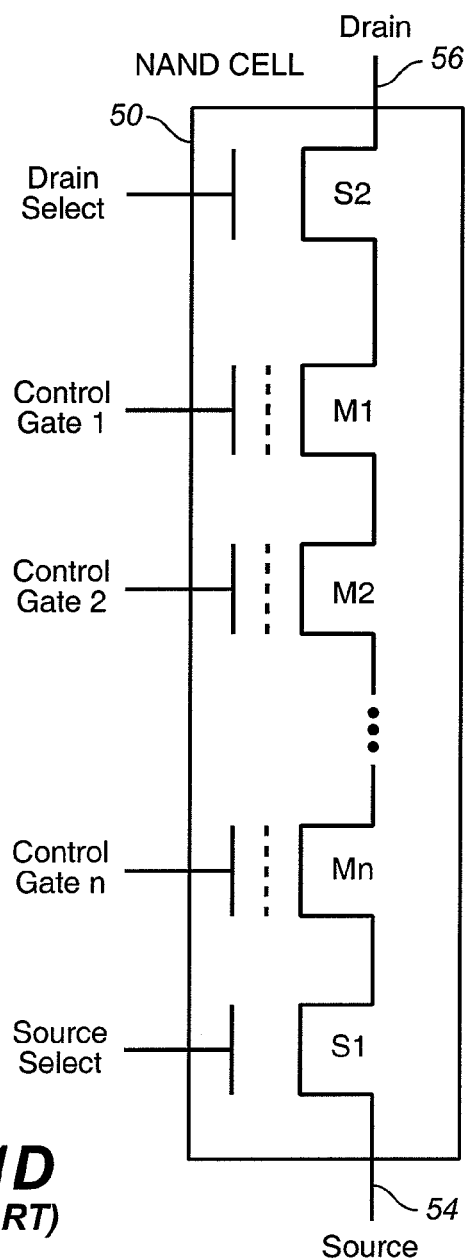
Figure 1E:
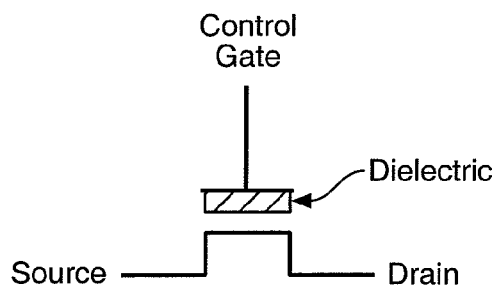
Figure 2:
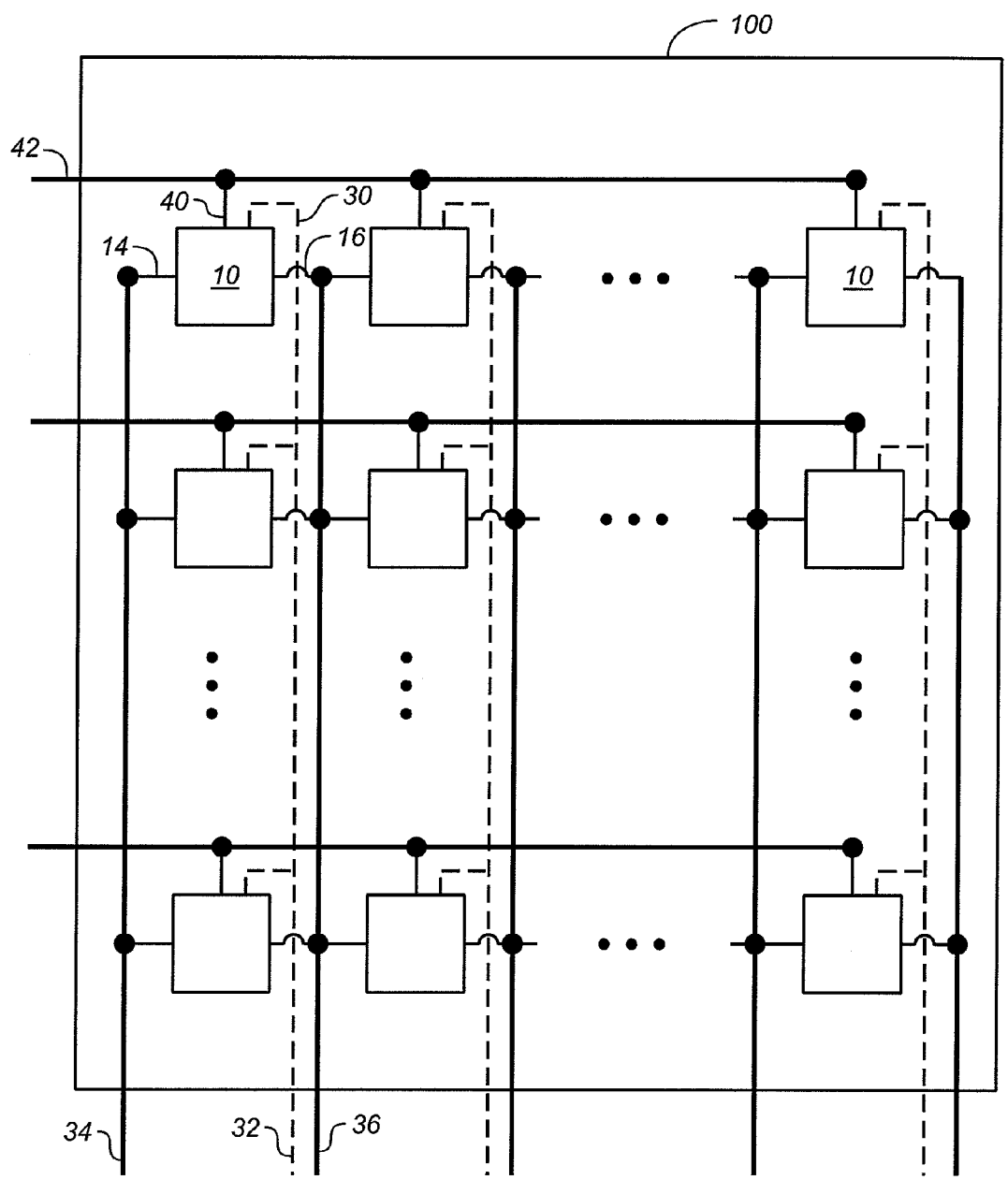
FIG. 2 illustrates an example of an NOR array of memory cells.
Figure 3:
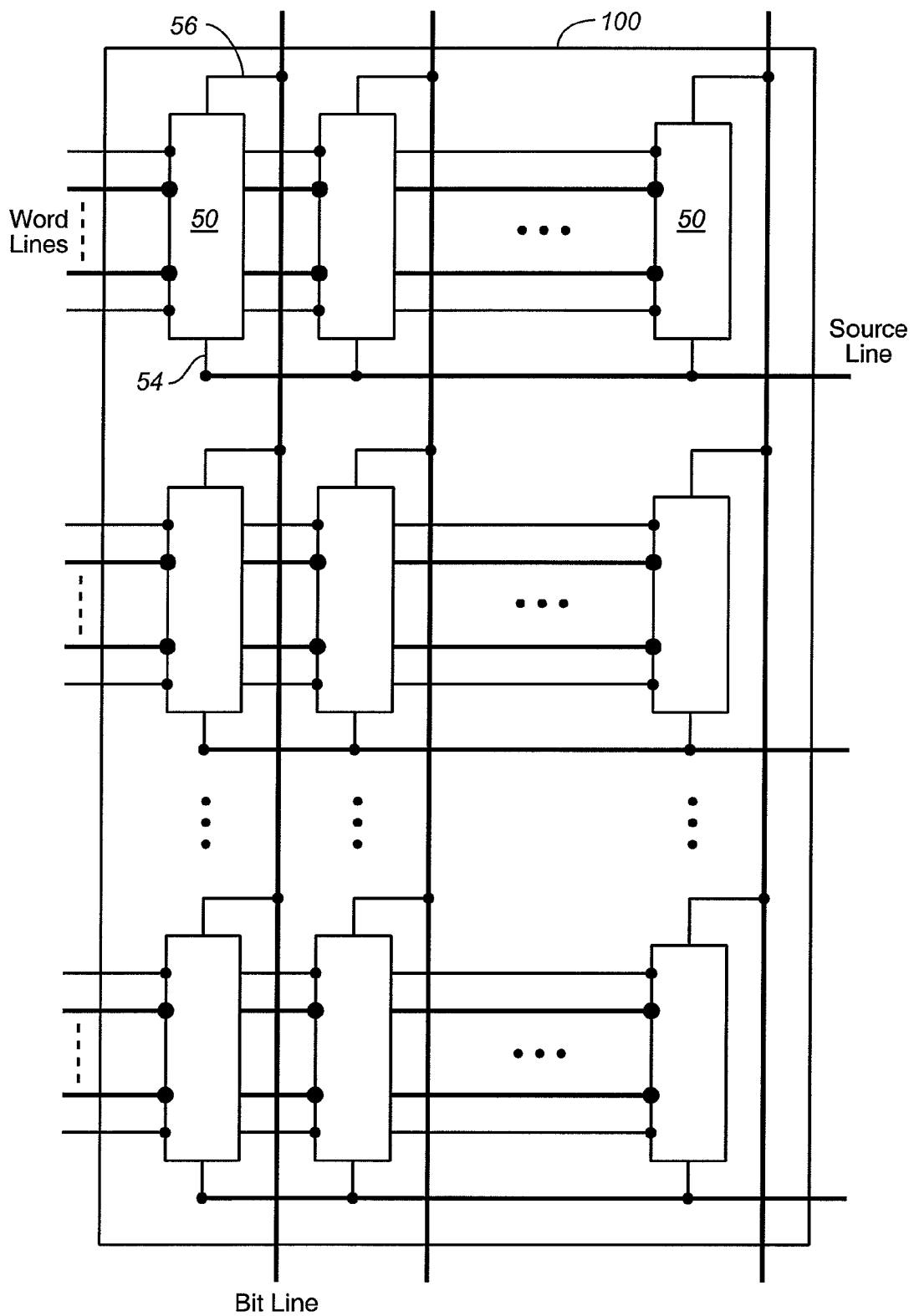
FIG. 3 illustrates an example of an NAND array of memory cells, such as that shown in FIG. 1D.
Figure 4:
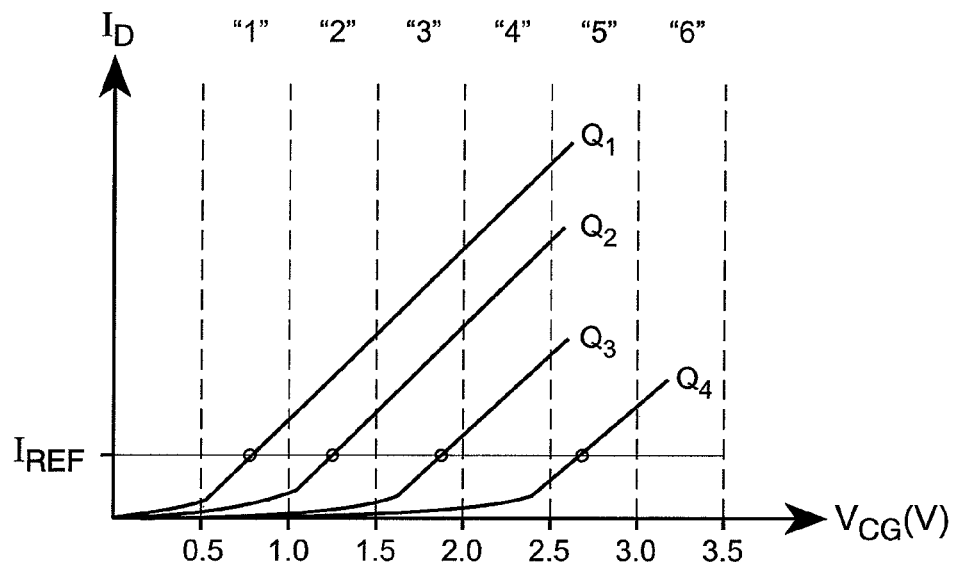
FIG. 4 illustrates the relation between the source-drain current and the control gate voltage for four different charges Q1-Q4 that the floating gate may be storing at any one time.
Figure 5:
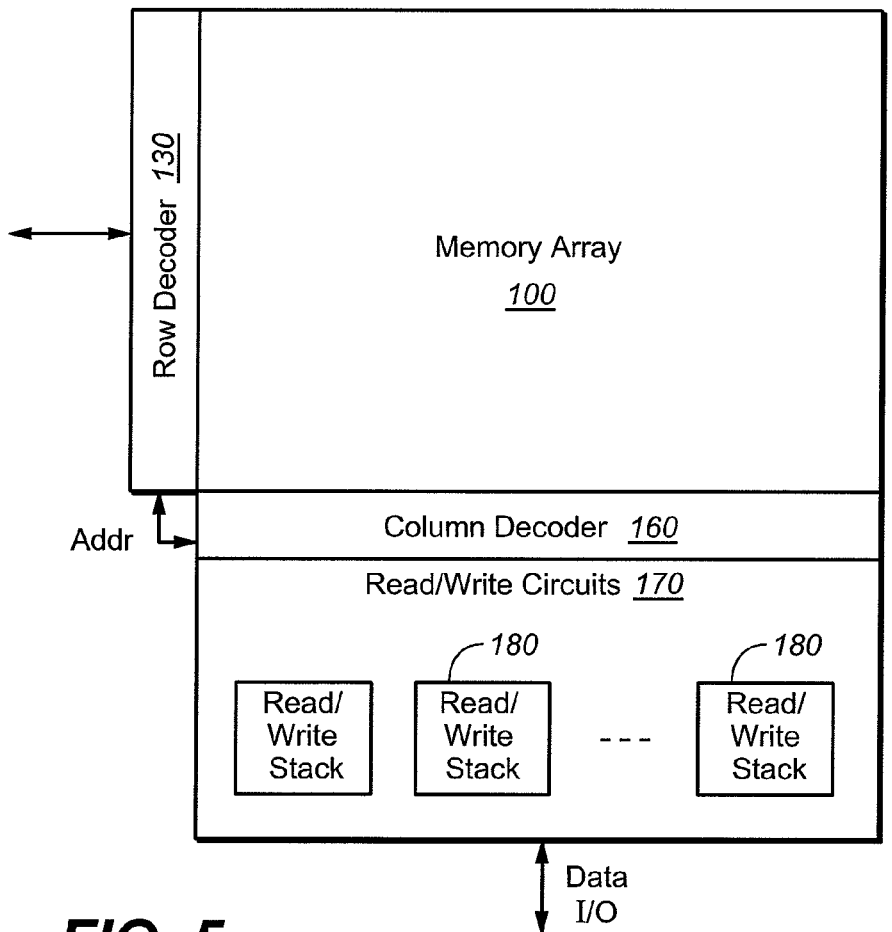
FIG. 5 illustrates schematically a typical arrangement of a memory array accessible by read/write circuits via row and column decoders.
Figure 6A:
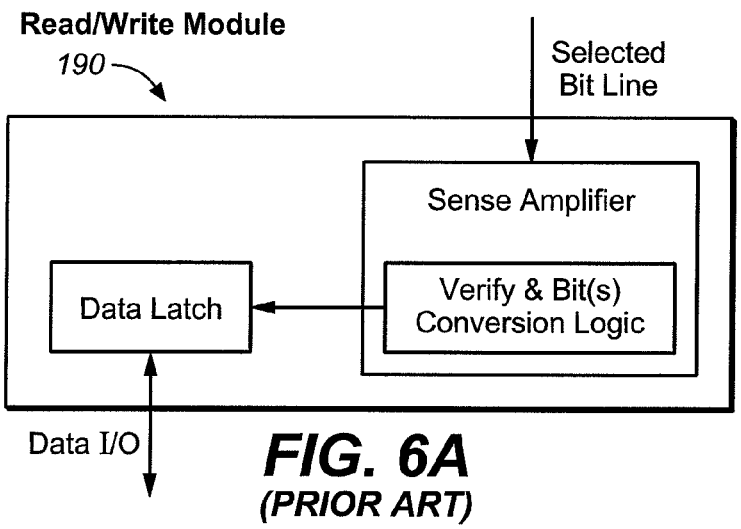
FIG. 6A is a schematic block diagram of an individual read/write module.
Figure 6B:
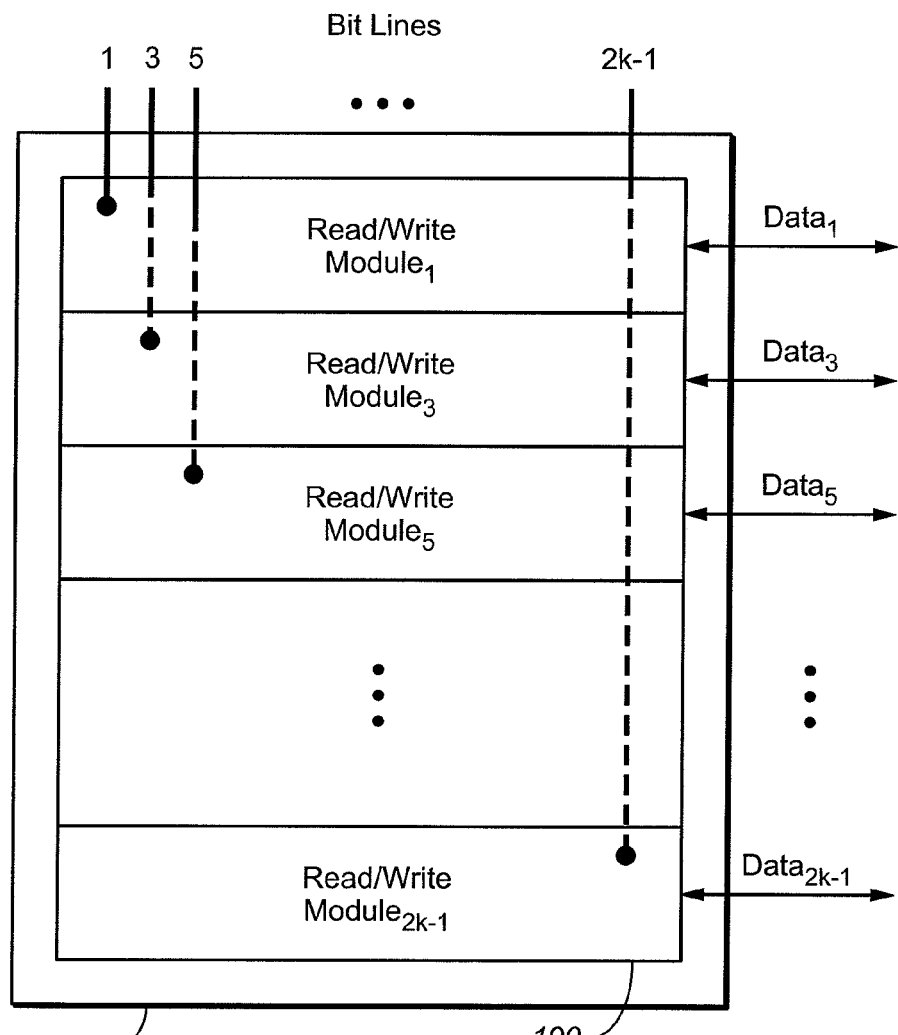
FIG. 6B shows the read/write stack of FIG. 5 implemented conventionally by a stack of read/write modules.
Figure 7A:
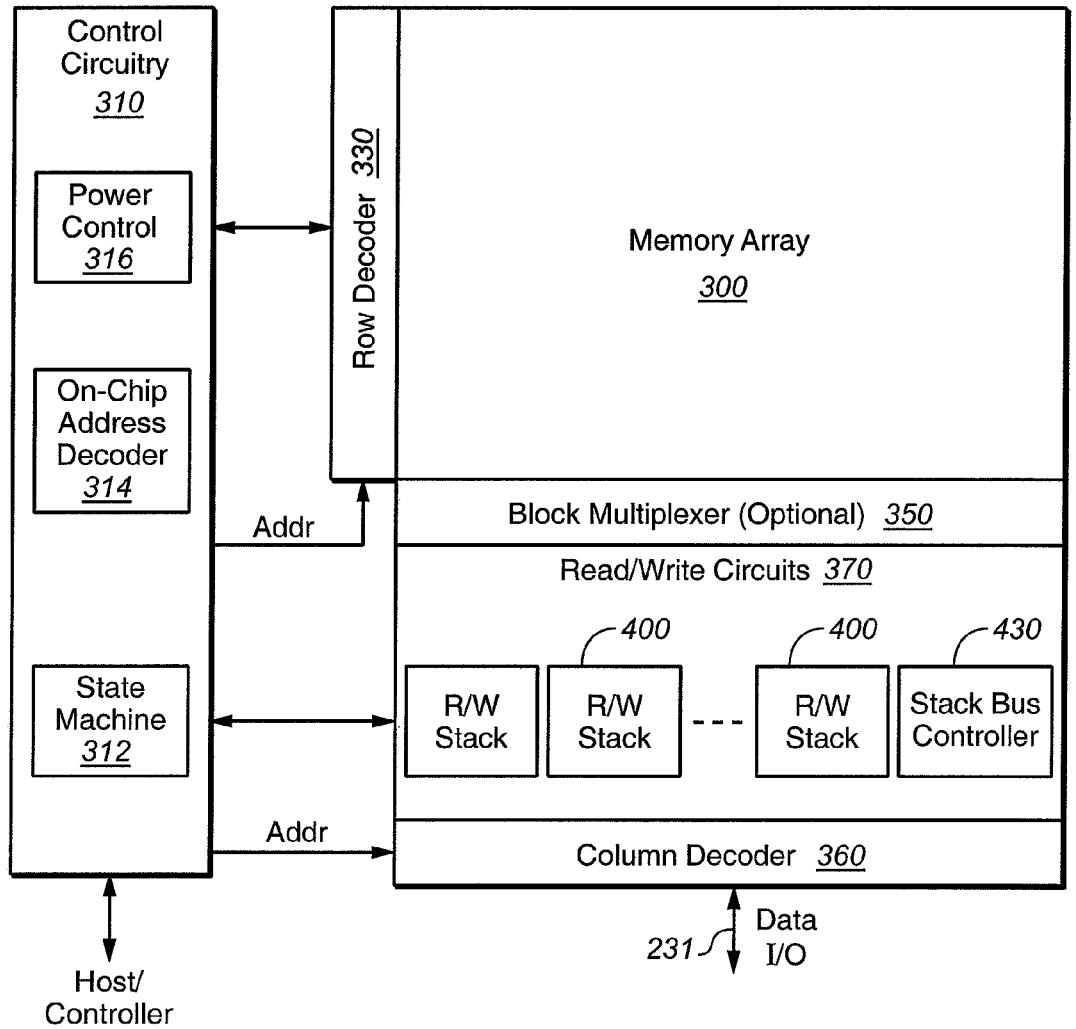
FIG. 7A illustrates schematically a compact memory device having a bank of partitioned read/write stacks, in which the improved processor of the present invention is implemented.

FIG. 7A illustrates schematically a compact memory device having a bank of partitioned read/write stacks, in which the improved processor of the present invention is implemented. The memory device includes a two-dimensional array of memory cells 300, control circuitry 310, and read/write circuits 370. The memory array 300 is addressable by word lines via a row decoder 330 and by bit lines via a column decoder 360. The read/write circuits 370 is implemented as a bank of partitioned read/write stacks 400 and allows a block (also referred to as a "page") of memory cells to be read or programmed in parallel. In a preferred embodiment, a page is constituted from a contiguous row of memory cells. In another embodiment, where a row of memory cells are partitioned into multiple blocks or pages, a block multiplexer 350 is provided to multiplex the read/write circuits 370 to the individual blocks.

The control circuitry 310 cooperates with the read/write circuits 370 to perform memory operations on the memory array 300. The control circuitry 310 includes a state machine 312, an on-chip address decoder 314 and a power control module 316. The state machine 312 provides chip level control of memory operations. The on-chip address decoder 314 provides an address interface between that used by the host or a memory controller to the hardware address used by the decoders 330 and 370. The power control module 316 controls the power and voltages supplied to the word lines and bit lines during memory operations.

Figure 7B:
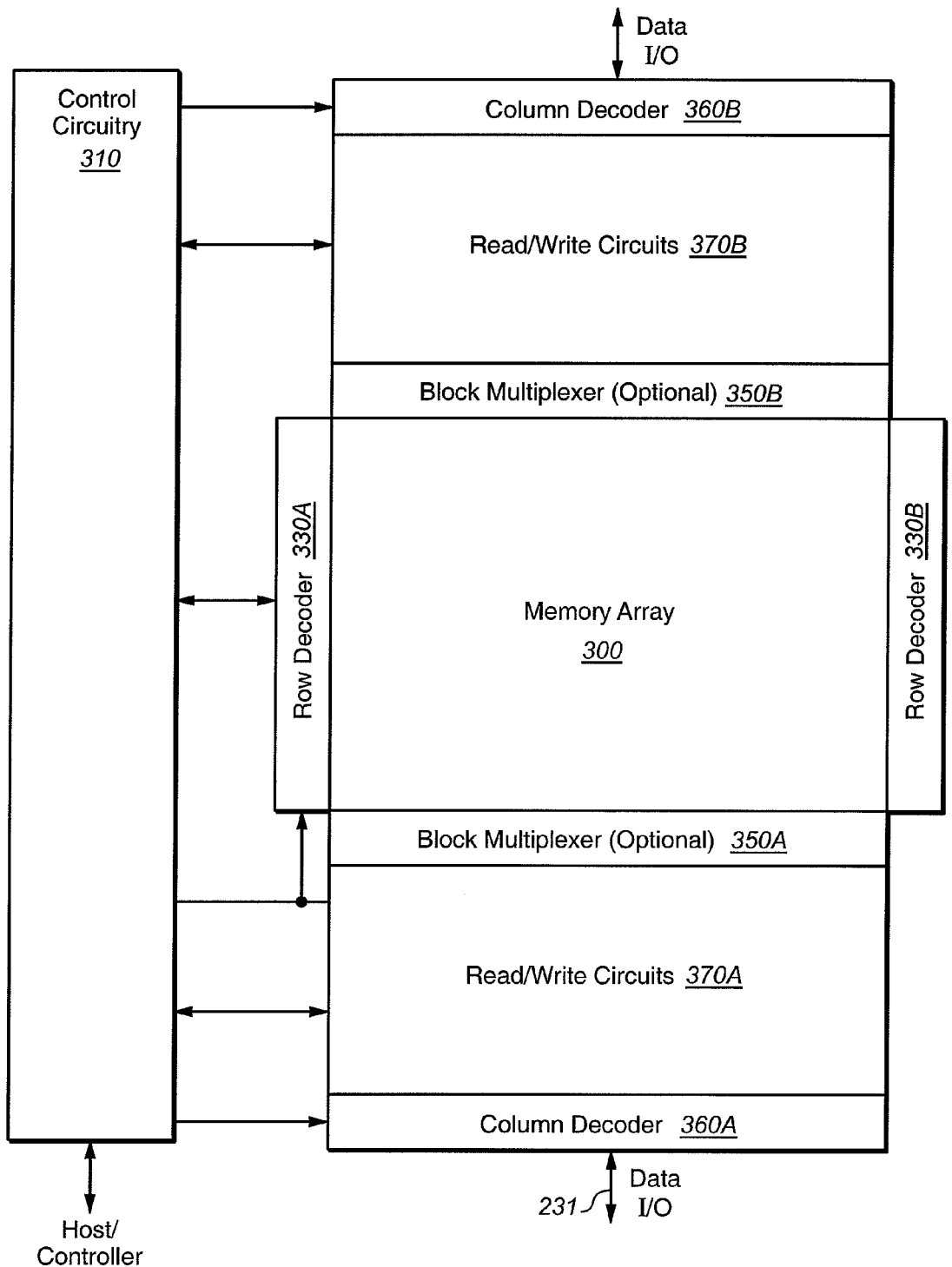
FIG. 7B illustrates a preferred arrangement of the compact memory device shown in FIG. 7A.

FIG. 7B illustrates a preferred arrangement of the compact memory device shown in FIG. 7A. Access to the memory array 300 by the various peripheral circuits is implemented in a symmetric fashion, on opposite sides of the array so that access lines and circuitry on each side are reduced in half. Thus, the row decoder is split into row decoders 330A and 330B and the column decoder into column decoders 360A and 360B. In the embodiment where a row of memory cells are partitioned into multiple blocks, the block multiplexer 350 is split into block multiplexers 350A and 350B. Similarly, the read/write circuits are split into read/write circuits 370A connecting to bit lines from the bottom and read/write circuits 370B connecting to bit lines from the top of the array 300. In this way, the density of the read/write modules, and therefore that of the partitioned read/write stacks 400, is essentially reduced by one half.

Figure 8:
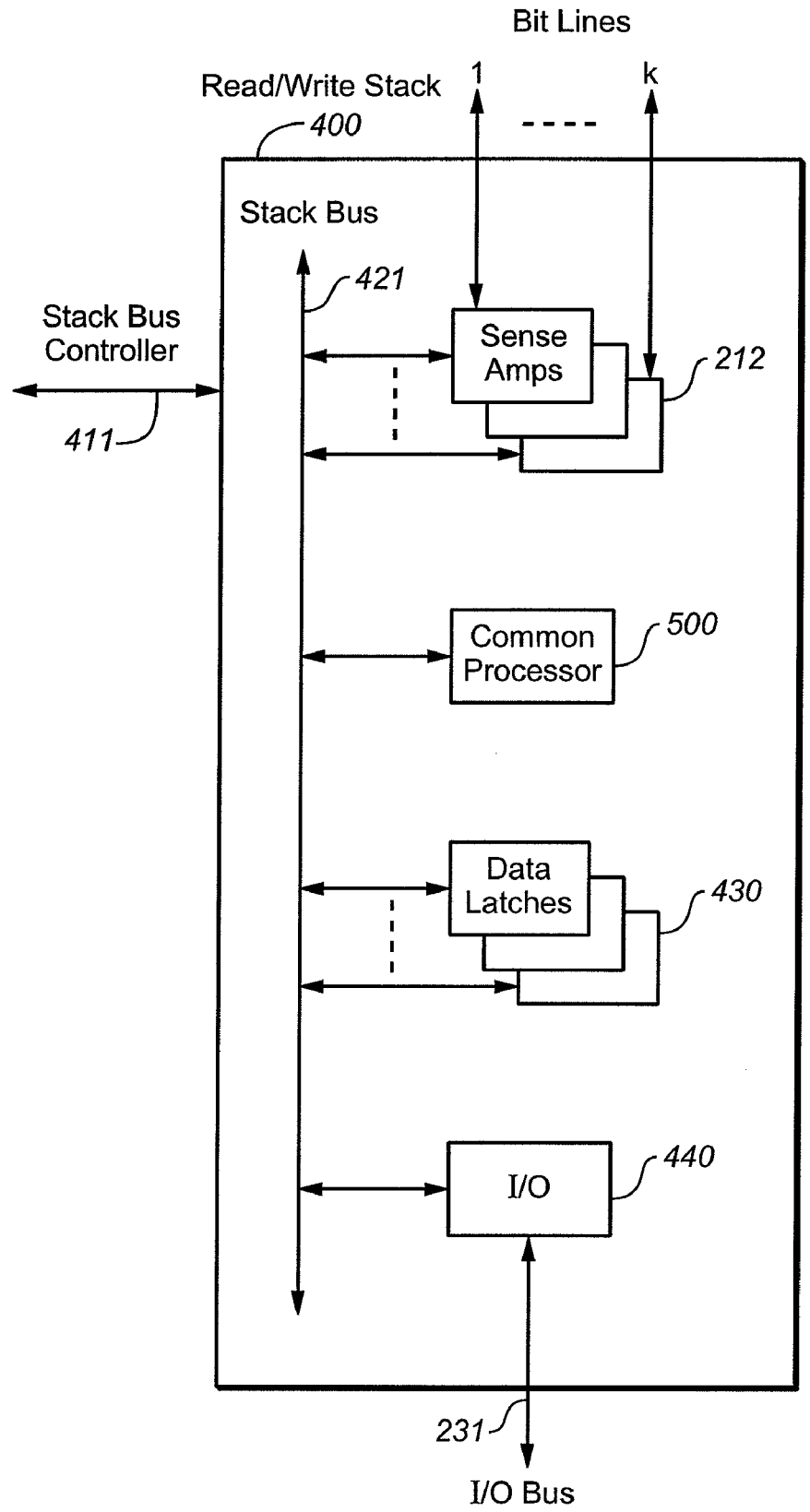
FIG. 8 illustrates schematically a general arrangement of the basic components in a read/write stack shown in FIG. 7A.

FIG. 8 illustrates schematically a general arrangement of the basic components in a read/write stack shown in FIG. 7A. According to a general architecture of the invention, the read/write stack 400 comprises a stack of sense amplifiers 212 for sensing k bit lines, an I/O module 440 for input or output of data via an I/O bus 231, a stack of data latches 430 for storing input or output data, a common processor 500 to process and store data among the read/write stack 400, and a stack bus 421 for communication among the stack components. A stack bus controller among the read/write circuits 370 provides control and timing signals via lines 411 for controlling the various components among the read/write stacks.

Figure 9:
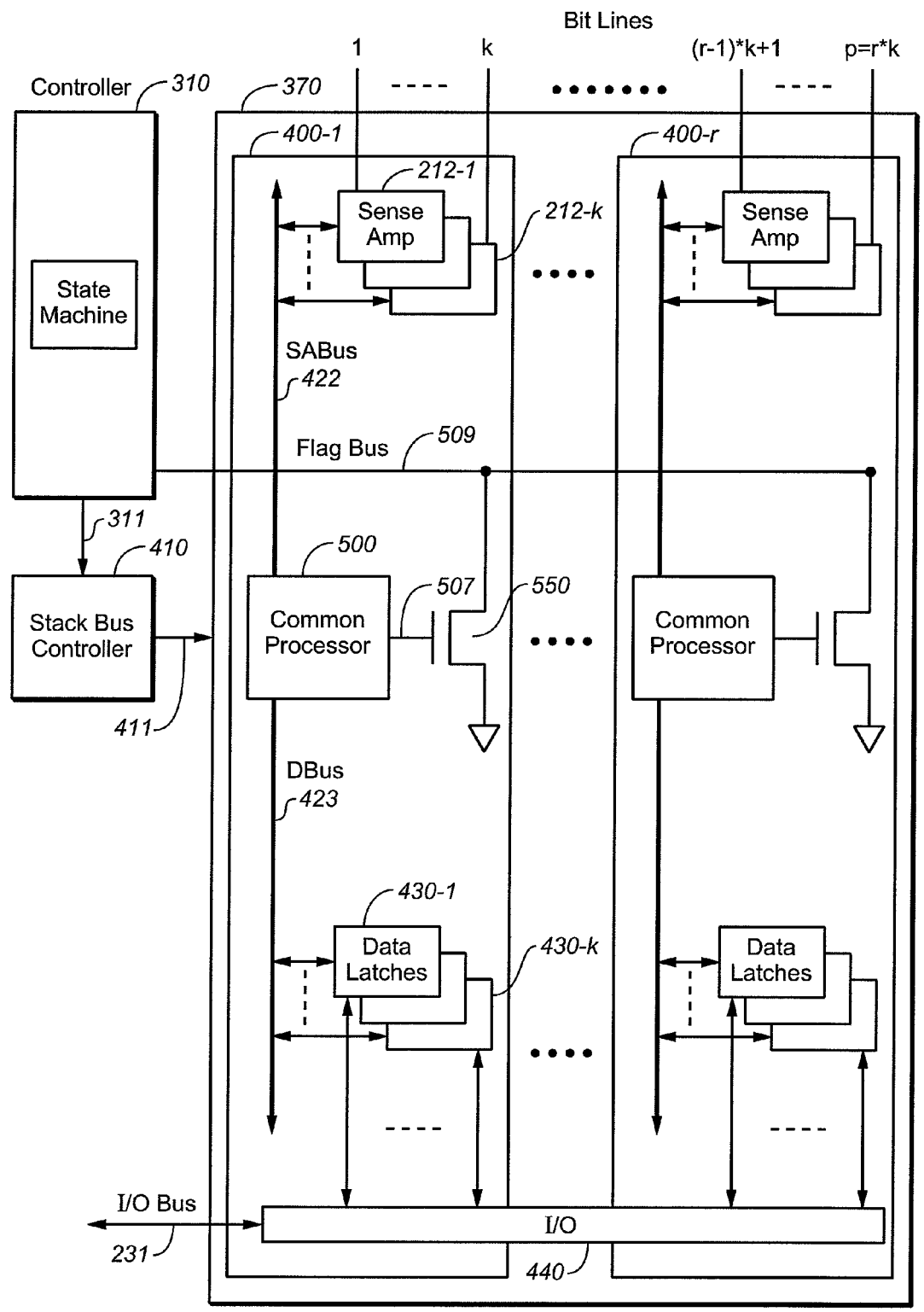
FIG. 9 illustrates one preferred arrangement of the read/write stacks among the read/write circuits shown in FIGS. 7A and 7B.

FIG. 9 illustrates one preferred arrangement of the read/write stacks among the read/write circuits shown in FIGS. 7A and 7B. Each read/write stack 400 operates on a group of k bit lines in parallel. If a page has p=r*k bit lines, there will be r read/write stacks, 400-1, . . . , 400-r.

The entire bank of partitioned read/write stacks 400 operating in parallel allows a block (or page) of p cells along a row to be read or programmed in parallel. Thus, there will be p read/write modules for the entire row of cells. As each stack is serving k memory cells, the total number of read/write stacks in the bank is therefore given by r=p/k. For example, if r is the number of stacks in the bank, then p=r*k. One example memory array may have p=512 bytes (512×8 bits), k=8, and therefore r=512. In the preferred embodiment, the block is a run of the entire row of cells. In another embodiment, the block is a subset of cells in the row. For example, the subset of cells could be one half of the entire row or one quarter of the entire row. The subset of cells could be a run of contiguous cells or one every other cell, or one every predetermined number of cells.

Each read/write stack, such as 400-1, essentially contains a stack of sense amplifiers 212-1 to 212-k servicing a segment of k memory cells in parallel. A preferred sense amplifier is disclosed in US Patent Publication No. 2004-0109357-A1, the entire disclosure of which is hereby incorporated herein by reference.

The stack bus controller 410 provides control and timing signals to the read/write circuit 370 via lines 411. The stack bus controller is itself dependent on the memory controller 310 via lines 311. Communication among each read/write stack 400 is effected by an interconnecting stack bus 431 and controlled by the stack bus controller 410. Control lines 411 provide control and clock signals from the stack bus controller 410 to the components of the read/write stacks 400-1.

In the preferred arrangement, the stack bus is partitioned into a SABus 422 for communication between the common processor 500 and the stack of sense amplifiers 212, and a DBus 423 for communication between the processor and the stack of data latches 430.

The stack of data latches 430 comprises of data latches 430-1 to 430-k, one for each memory cell associated with the stack The I/O module 440 enables the data latches to exchange data with the external via an I/O bus 231.

The common processor also includes an output 507 for output of a status signal indicating a status of the memory operation, such as an error condition. The status signal is used to drive the gate of an n-transistor 550 that is tied to a FLAG BUS 509 in a Wired-Or configuration. The FLAG BUS is preferably precharged by the controller 310 and will be pulled down when a status signal is asserted by any of the read/write stacks.

Figure 10:
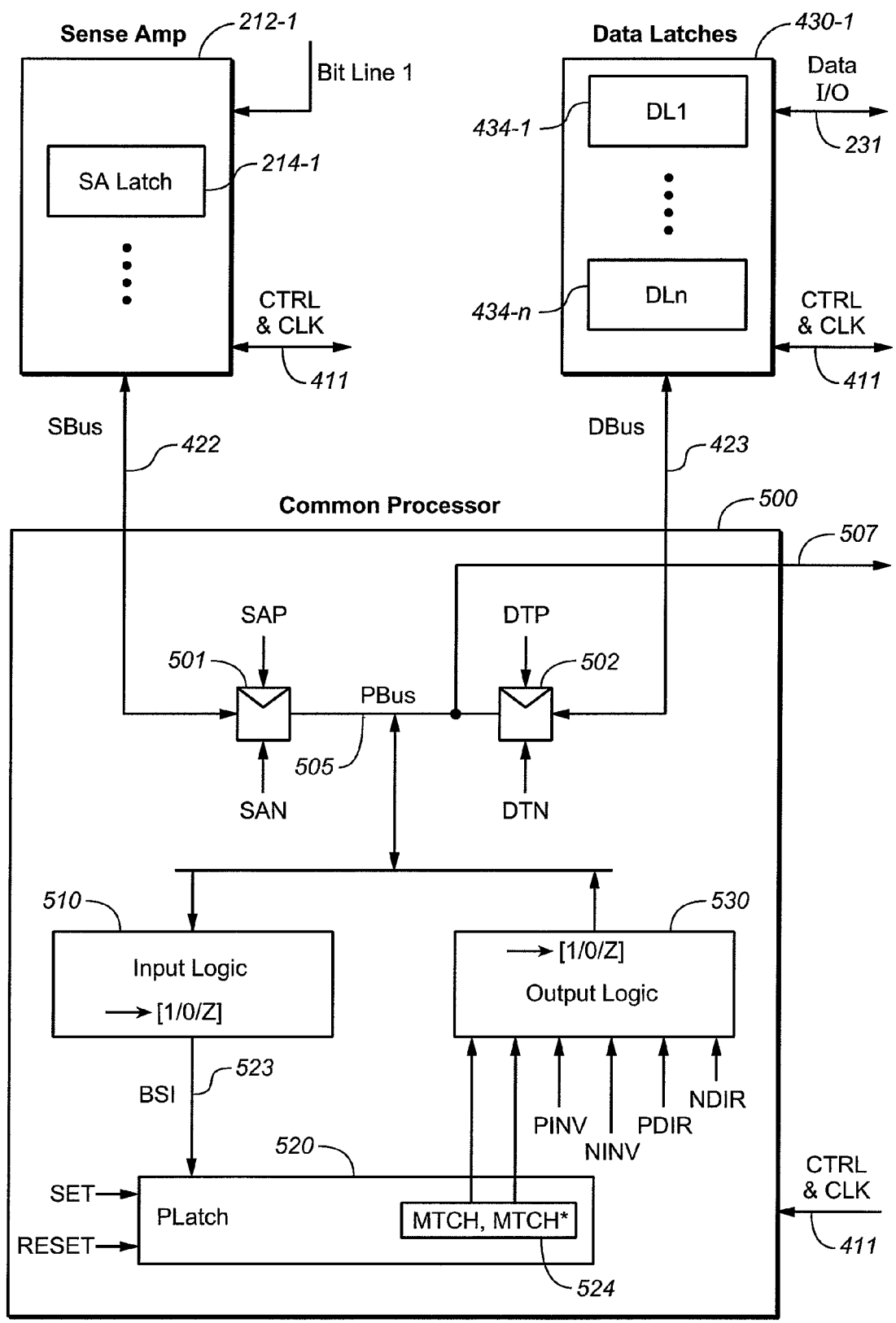
FIG. 10 illustrates an improved embodiment of the common processor shown in FIG. 9.

FIG. 10 illustrates an improved embodiment of the common processor shown in FIG. 9. The common processor 500 comprises a processor bus, PBUS 505 for communication with external circuits, an input logic 510, a processor latch PLatch 520 and an output logic 530.

The input logic 510 receives data from the PBUS and outputs to a BSI node as a transformed data in one of logical states "1", "0", or "Z" (float) depending on the control signals from the stack bus controller 410 via signal lines 411. A Set/Reset latch, PLatch 520 then latches BSI, resulting in a pair of complementary output signals as MTCH and MTCH*.

The output logic 530 receives the MTCH and MTCH* signals and outputs on the PBUS 505 a transformed data in one of logical states "1", "0", or "Z" (float) depending on the control signals from the stack bus controller 410 via signal lines 411.

At any one time the common processor 500 processes the data related to a given memory cell. For example, FIG. 10 illustrates the case for the memory cell coupled to bit line 1. The corresponding sense amplifier 212-1 comprises a node where the sense amplifier data appears. In the preferred embodiment, the node assumes the form of a SA Latch, 214-1 that stores data. Similarly, the corresponding set of data latches 430-1 stores input or output data associated with the memory cell coupled to bit line 1. In the preferred embodiment, the set of data latches 430-1 comprises sufficient data latches, 434-1, . . . , 434-n for storing n-bits of data.

The PBUS 505 of the common processor 500 has access to the SA latch 214-1 via the SBUS 422 when a transfer gate 501 is enabled by a pair of complementary signals SAP and SAN. Similarly, the PBUS 505 has access to the set of data latches 430-1 via the DBUS 423 when a transfer gate 502 is enabled by a pair of complementary signals DTP and DTN. The signals SAP, SAN, DTP and DTN are illustrated explicitly as part of the control signals from the stack bus controller 410.

Figures 11A, 11B:
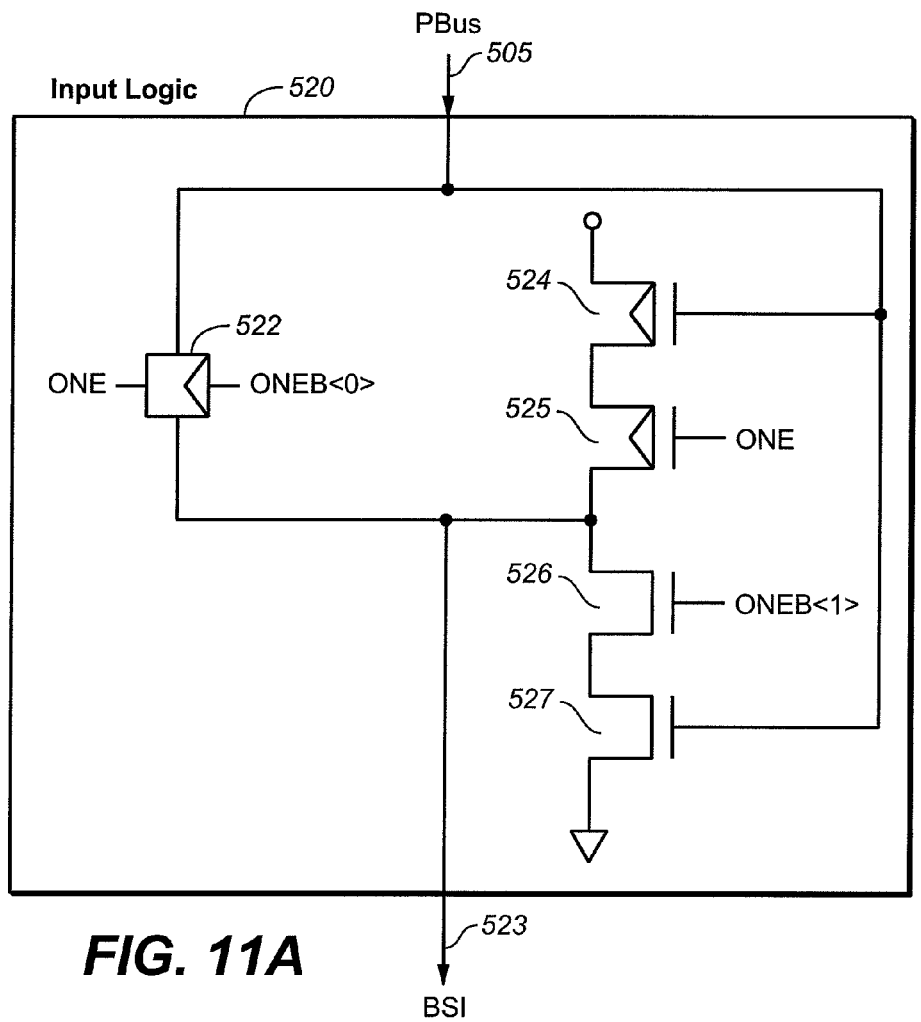
FIG. 11A illustrates a preferred embodiment of the input logic of the common processor shown in FIG. 10.
FIG. 11B illustrates the truth table of the input logic of FIG. 11A.

FIG. 11A illustrates a preferred embodiment of the input logic of the common processor shown in FIG. 10. The input logic 520 receives the data on the PBUS 505 and depending on the control signals, either has the output BSI being the same, or inverted, or floated. The output BSI node is essentially affected by either the output of a transfer gate 522 or a pull-up circuit comprising p-transistors 524 and 525 in series to Vdd, or a pull-down circuit comprising n-transistors 526 and 527 in series to ground. The pull-up circuit has the gates to the p-transistor 524 and 525 respectively controlled by the signals PBUS and ONE. The pull-down circuit has the gates to the n-transistors 526 and 527 respectively controlled by the signals ONEB<1> and PBUS.

FIG. 11B illustrates the truth table of the input logic of FIG. 11A. The logic is controlled by PBUS and the control signals ONE, ONEB<0>, ONEB<1> which are part of the control signals from the stack bus controller 410. Essentially, three transfer modes, PASSTHROUGH, INVERTED, and FLOATED, are supported.

In the case of the PASSTHROUGH mode where BSI is the same as the input data, the signals ONE is at a logical "1", ONEB<0> at "0" and ONEB<1> at "0". This will disable the pull-up or pull-down but enable the transfer gate 522 to pass the data on the PBUS 505 to the output 523. In the case of the INVERTED mode where BSI is the invert of the input data, the signals ONE is at "0", ONEB<0> at "1" and ONE<1> at "1". This will disable the 522. Also, when PBUS is at "0", the pull-down circuit will be disabled while the pull-up circuit is enabled, resulting in BSI being at "1". Similarly, when PBUS is at "1", the pull-up circuit is disabled while the pull-down circuit is enabled, resulting in BSI being at "0". Finally, in the case of the FLOATED mode, the output BSI can be floated by having the signals ONE at "1", ONEB<0> at "1" and ONEB<1> at "0". The FLOATED mode is listed for completeness although in practice, it is not used.

Figures 12A, 12B:
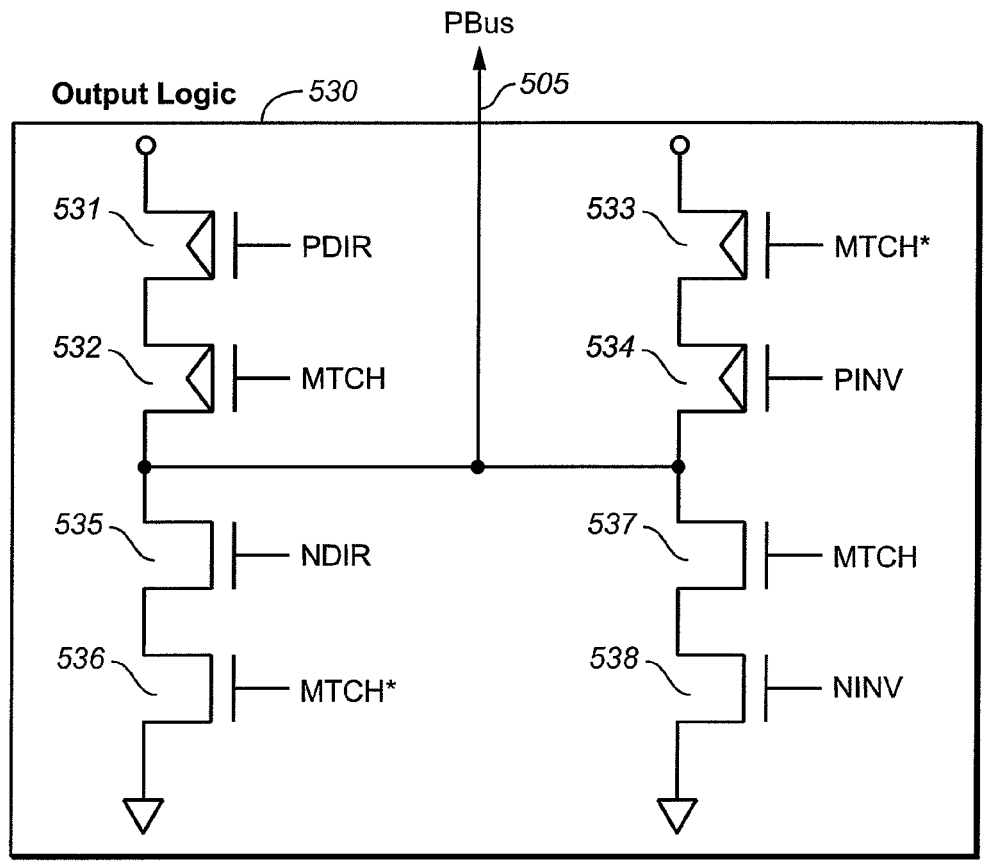
FIG. 12A illustrates a preferred embodiment of the output logic of the common processor shown in FIG. 10.
FIG. 12B illustrates the truth table of the output logic of FIG. 12A.

FIG. 12A illustrates a preferred embodiment of the output logic of the common processor shown in FIG. 10. The signal at the BSI node from the input logic 520 is latched in the processor latch, PLatch 520. The output logic 530 receives the data MTCH and MTCH* from the output of PLatch 520 and depending on the control signals, outputs on the PBUS as either in a PASSTHROUGH, INVERTED OR FLOATED mode. In other words, the four branches act as drivers for the PBUS 505, actively pulling it either to a HIGH, LOW or FLOATED state. This is accomplished by four branch circuits, namely two pull-up and two pull-down circuits for the PBUS 505. A first pull-up circuit comprises p-transistors 531 and 532 in series to Vdd, and is able to pull up the PBUS when MTCH is at "0". A second pull-up circuit comprises p-transistors 533 and 534 in series to ground and is able to pull up the PBUS when MTCH is at "1". Similarly, a first pull-down circuit comprises n-transistors 535 and 536 in series to Vdd, and is able to pull down the PBUS when MTCH is at "0". A second pull-up circuit comprises n-transistors 537 and 538 in series to ground and is able to pull up the PBUS when MTCH is at "1".

One feature of the invention is to constitute the pull-up circuits with PMOS transistors and the pull-down circuits with NMOS transistors. Since the pull by the NMOS is much stronger than that of the PMOS, the pull-down will always overcome the pull-up in any contentions. In other words, the node or bus can always default to a pull-up or "1" state, and if desired, can always be flipped to a "0" state by a pull-down.

FIG. 12B illustrates the truth table of the output logic of FIG. 12A. The logic is controlled by MTCH, MTCH* latched from the input logic and the control signals PDIR, PINV, NDIR, NINV, which are part of the control signals from the stack bus controller 410. Four operation modes, PASSTHROUGH, INVERTED, FLOATED, and PRECHARGE are supported.

In the FLOATED mode, all four branches are disabled. This is accomplished by having the signals PINV=1, NINV=0, PDIR=1, NDIR=0, which are also the default values. In the PASSTHROUGH mode, when MTCH=0, it will require PBUS=0. This is accomplished by only enabling the pull-down branch with n-transistors 535 and 536, with all control signals at their default values except for NDIR=1. When MTCH=1, it will require PBUS=1. This is accomplished by only enabling the pull-up branch with p-transistors 533 and 534, with all control signals at their default values except for PINV=0. In the INVERTED mode, when MTCH=0, it will require PBUS=1. This is accomplished by only enabling the pull-up branch with p-transistors 531 and 532, with all control signals at their default values except for PDIR=0. When MTCH=1, it will require PBUS=0. This is accomplished by only enabling the pull-down branch with n-transistors 537 and 538, with all control signals at their default values except for NINV=1. In the PRECHARGE mode, the control signals settings of PDIR=0 and PINV=0 will either enable the pull-up branch with p-transistors 531 and 531 when MTCH=1 or the pull-up branch with p-transistors 533 and 534 when MTCH=0.

Common processor operations are developed more fully in U.S. patent application Ser. No. 11/026,536, Dec. 29, 2004, which is hereby incorporated in its entirety by this reference.

Quick Pass Write in All Bit Line Architectures

An important aspect in the performance of non-volatile memories is programming speed. This section discusses methods of improving programming performance of multi-state non-volatile memories and is presented in the context of a NAND memory with an all bit line (ABL) architecture. Specifically, the use of the registers of common processor shown in FIG. 10 to implement quick pass write is described.

The goal in programming a memory is to write the data quickly, but with precision. In a binary memory, it is only necessary to write all of the programmed states above a certain threshold level, while the unprogrammed stay below. In a multi-state memory, the situation is more complicated since, for the intermediate states, a level must be written above a certain threshold, but not too high or its distribution will impinge upon the next level up. This problem is aggravated as the number of states increases, the available threshold window is reduced, or both.

Figure 13:
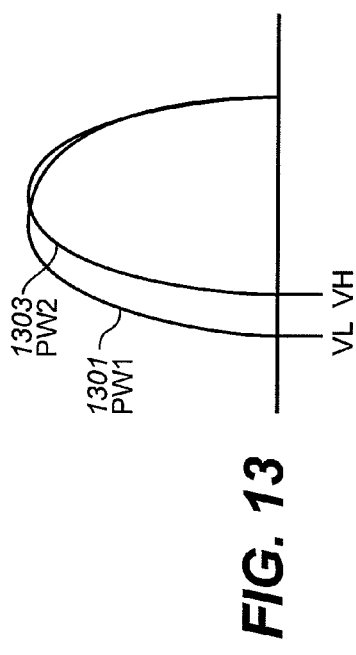
FIG. 13 shows two distributions of storage elements corresponding to the same memory state for a low and high verify level.
Figure 14:
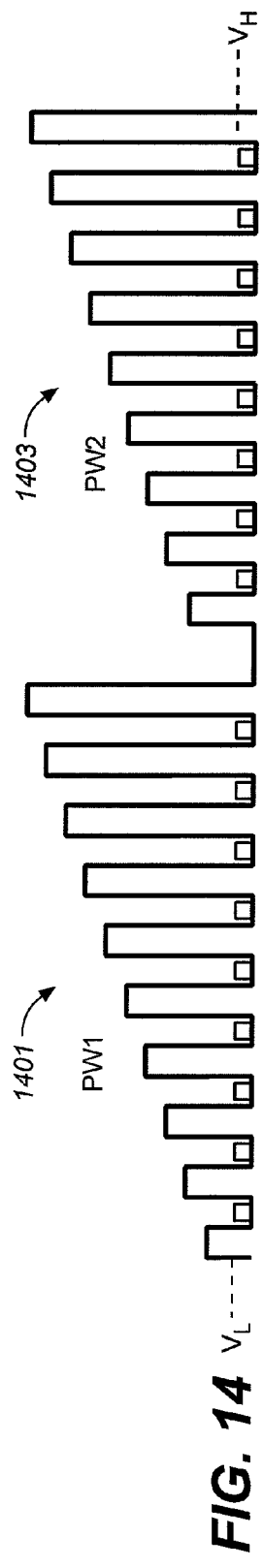
FIG. 14 illustrates an example of the programming waveform used in two pass write technique.

One technique to tighten the state distribution is by programming the same data multiple times. An example is the coarse-fine programming method described in U.S. Pat. No. 6,738,289, which is hereby incorporated by reference. FIG. 13 shows two distributions of storage elements corresponding to the same memory state, where in a first pass the cells have been written with a programming waveform PW1 using a first, lower verify level VL, producing distribution 1301. The programming waveform then starts over at lower value for the second pass. In the second pass, a programming waveform PW2 uses a second, higher verify level VH, to shift this to distribution 1303. This allows the first pass to place the cells into a rough distribution that is then tightened up in the second pass. A example of the programming waveform is shown in FIG. 14. The first staircase PW1 1401 uses the lower verify level VL, while PW2 uses the upper verify level VH. The second pass (PW2 1403) may use a small step size, as described in U.S. Pat. No. 6,738,289, but, aside from the different verify levels, the processes are the same.

Figure 15:
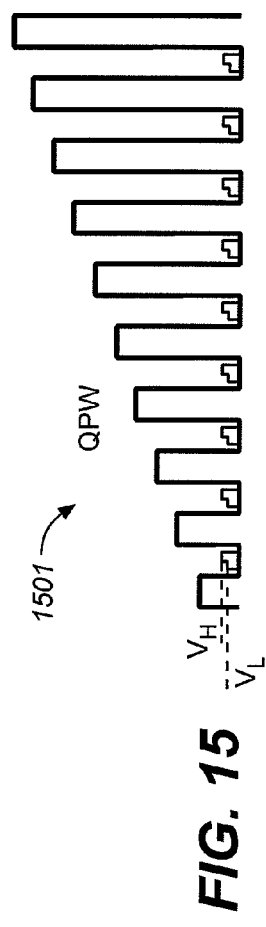
FIG. 15 illustrates an example of the programming waveform used in a quick pass write technique.

The shortcoming of this approach is that each programming sequence requires the programming waveform to go through both of the fall staircases, executing 1401 and starting over with 1403. Writing could be executed more quickly if it were possible to use a single staircase, allowing for the distribution to be subjected to an initial programming phase based on a lower verify VL, but still be able to slow down the process once this initial level is reached and refine the distribution using the higher verify VH. This can be achieved through a "Quick Pass Write" that uses bit line bias to program in a single staircase sequence for the programming waveform. This algorithm can achieve a similar effect to that of a two-pass write and is described in more detail in U.S. Pat. No. 6,643,188, which is hereby incorporated by reference in its entirety. The programming waveform QPW 1501 is shown in FIG. 15 and, in a first phase, the process proceeds as for the first phase of the two-pass algorithm, except that the verify is performed at both the VL and VH level (see FIG. 18 for detail); however, once a verify at VL occurs, rather than restart the staircase waveform, the staircase continues, but with the bit line voltage raised to slow the process as it continues until the cells verify at VH. Note that this allows the pulses of the programming waveform to be monotonically non-decreasing. This is explained further with respect to FIG. 16.

Figure 16:
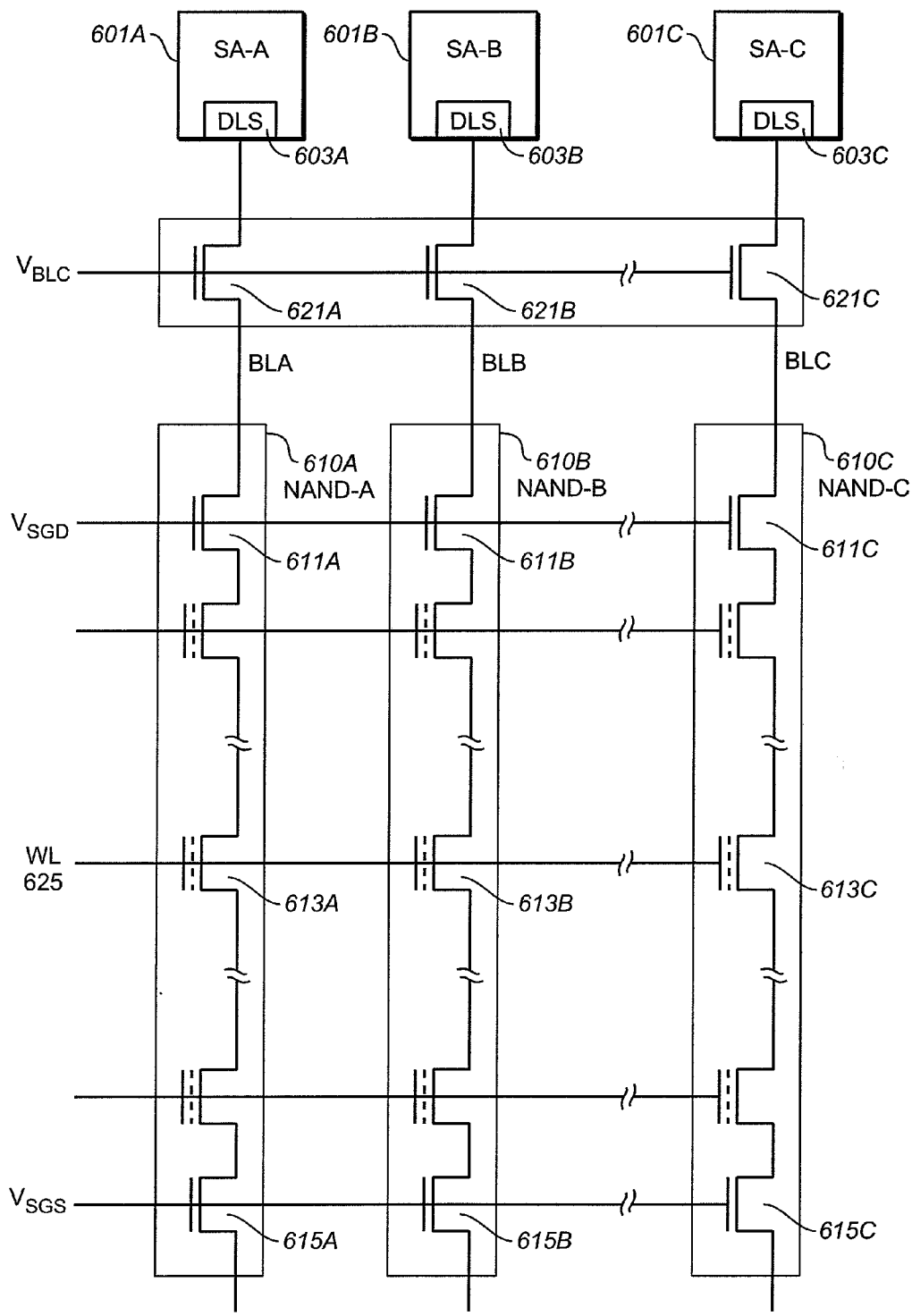
FIG. 16 shows a portion of a NAND-type array and its peripheral circuitry in the all bit line architecture.

FIG. 16 shows a portion of a NAND type array and its peripheral circuitry in the all bit line architecture. This is similar to the arrangement shown in a number of the preceding figures, but only the elements relevant to the present discussion are given here, with the other elements omitted to simplify the discussion. FIG. 16 also explicitly shows the bit line clamp 621 as separate from the other elements of the read/write stack. The details of the word line clamp are described farther in a U.S. patent application entitled "Non-Volatile Memory and Method with Power-Saving Read and Program-Verify Operations" filed Mar. 16, 2005, and, particularly, U.S. Pat. No. 11/015,199, filed Dec. 16, 2004, which are both incorporated by reference above. It should be noted that all though the present invention is discussed primarily in terms of a NAND type array using the all bit line architecture, the invention is not so limited. As will be seen in the following, the invention relates to a quick pass write, or more generally a two-phase programming process, and the use of data latches to monitor and control this process. So although this is described based on a particular embodiment for explanatory purposes, it can be applied far more generally.

FIG. 16 shows three NAND strings 610 A-C each connected along a corresponding bit line through bit line clamp 621 to a respective sense amplifier SA-A to SA-C 601A-C. Each sense amp SA 601 has a data latch DLS 603 explicitly indicated, corresponding to SA Latch 214 above (e.g., FIG. 10). The bit line clamp 621 is used to control the voltage level and current flow along the bit line of the corresponding NAND string and the different clamps in a section of the array are commonly controlled by the voltage $V_{BLC}$. In each NAND string 610, source select gate (SGS 615) and drain select gate (SGD 611) are explicitly shown and are controlled, respectively, by $V_{SGD}$ and $V_{SGS}$ for the entire row. The row of cells (613) along word line WL 625 is used as the exemplary selected row for the following description.

The selected memory cells, such as 613A, are programmed by establishing a voltage difference between the control gate and channel, causing charge to accumulate on the floating gate. The programming waveform, QPW 1501 of FIG. 15, is applied along the selected word line WL 625. Consider the case where the cells along WL 625 are to be programmed in strings A and B, but not in string C. For cells to be programmed, such as cells 613A and 613B in rows A and B, the channel is held low (ground) to establish the needed potential difference. This is done by setting bit lines BL-A and BL-B to ground (corresponding to programmed data, "0") by the pull down circuits; turning on the bit line clamps 621 and drain side select transistors by setting $V_{BLC}=V_{SGD}=V_{dd}+V_T$, where $V_T$ is the appropriate threshold voltage; and turning off the source side select gates by taking $V_{SGS}$ low. This hold the channel in NAND-A and NAND-B to ground and the programming pulse at the gates of 613A and 613B will transfer charge to the floating gate.

For cell 613C, which is not to be programmed, or program inhibited, (corresponding to erased data or locked out data "1"), the same voltages are applied to the bit line clamp, select gates, and word line; however, based on the data "1" latched into the sense amp sets bit line BLC above the clamp 621-C to $V_{dd}$. As the gate of 621-C is at $V_{BLC}=V_{dd}+V_T$, this effectively shuts off transistor 621-C, allowing the channel of NAND-C to float. Consequently, when a programming pulse is applied to 613C, the channel is pulled up and inhibited from programming.

As described so far, this procedure is largely the same as would be done for the first pass of two-pass programming and for a standard single pass programming. In between programming pulses, a verify is performed. Whether a cell is to be programmed corresponds to the VH value of the target state. In a two-pass programming algorithm, the verifies of the first pass use the lower VL level, while those of the second pass uses the VH level. The present technique differs from the two-pass technique in that both the VL and the VH levels are used for the verifies are performed between pulses and in what happens once a cell verifies at this lower level. In the two pass technique, after a successful verify at the lower VL level, the programming waveform starts over but the verifies now use the VH level; here, the programming waveform continues, but the bit line biases are altered, being raised in order to slow down the programming rate. (In a variation of the quick pass write, the lower verify could be dropped, leaving only the VH verify, once the second phase begins. Similarly, on the first few pulses, the VH verify could be omitted. However, as this increases the complexity of the operation and the saving are relatively small, the present embodiment will include both the VL and VH verifies through out a given write process.)

The procedures to set the bit line bias at the beginning of the program pulse is thus to use the program verify VH data in the data latches to set up the data in the sense amp latch 603-$i$ to charge bit line BL-$i$ to either 0 (to program selected cells) or $V_{dd}$ (to inhibit non-selected cells), where the bit line clamp has already been set at $V_{BLC}=V_{dd}+V_T$ to allow bit line charge up to the full $V_{dd}$ value on non-selected bit lines. The bit line value can then be raised by moving voltage $V_{BLC}$ on the bit line clamps 621-$i$ from $V_{BLC}=V_{dd}+V_T$, where the transistors 621-$i$ are fully on, to $V_{BLC}=V_{QPW}+V_T$, where $V_{QPW}$ is less than $V_{dd}$. Once one of the cells verifies at the VL level for the target state and this result is then transferred back to the sense amp latch 603-$i$, the bit line voltage level is then raised. For the selected bit lines, this raises the bit line from ground to $V_{QPW}$, slowing programming; for the inhibited bit lines, these remain floating. The non-selected cells will still be program inhibited, but the channel in the selected NAND strings will raise somewhat, slowing down the programming rate even though the programming voltage waveform supplied along WL 625 continues to ascend the staircase.

Once the bit line voltage is raised, the second phase continues along the same programming waveform, but the inter-pulse verifies use the higher VH level of the target state. As the cells individual verify, they are locked out as the corresponding latch DLS 603 flips and the bit line is raised to $V_{dd}$. The process continues until the entire page is finished writing.

Figure 17:
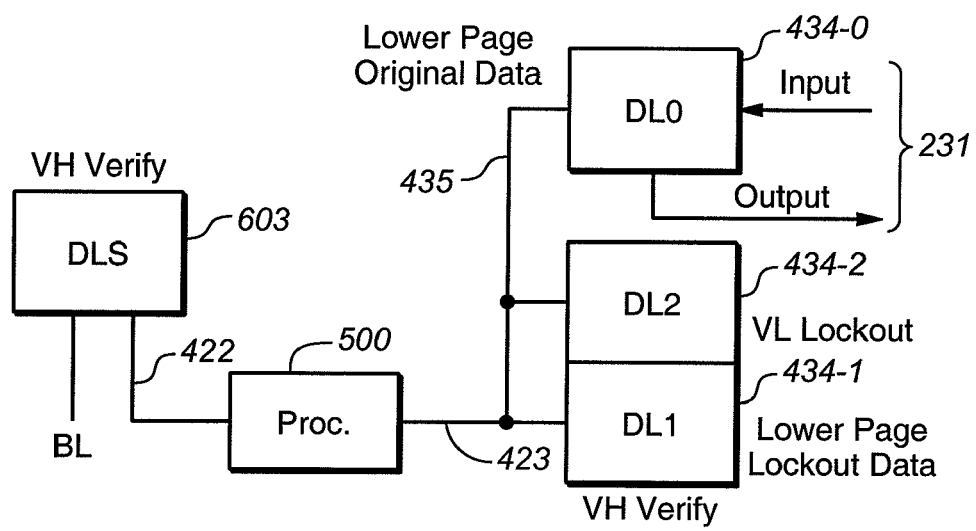
FIG. 17 describes the use of the data latches of FIG. 10 to implement quick pass write for a lower data page.

FIG. 17 describes the use of the data latches 434-i of 430 (FIG. 10) of the exemplary all bit line architecture to implement this process. FIG. 17 reproduces only selected items of FIG. 10, arranged in an exemplary topology, in order to simplify discussion. These include data latch DL0 434-0, which is connected Data I/O line 231, data latch DL1 434-1, connected to common processor 500 by line 423, data latch DL2 434-2, commonly connected with the other data latches by line 435, and sense amp data latch DLS 603 (equivalent to 214 of FIG. 10), which is connected to common processor 500 by line 422.

Although only two data bits are programmed into each memory storage element, each bit line has three associated data latches. (In the more general n-bit case, the number of data latches would be n+1). The introduction of the extra latch, DL2 434-2, is used to manage which of the two programming phases the quick pass write algorithm is executing. As described above, and in the other incorporated references, the data latches DL0 434-0 and DL1 434-1 are used for writing the two bits of data into the cell based upon the "standard" verify level VH: when the lower page is being programmed, only one of this latches is strictly required, but when the upper page is being programmed one of these latches is used for the data of the upper page and the other for the previously programmed lower page, since the programming of the upper page depends upon the state of the lower page in this arrangement. By introducing the additional latch, DL2 434-2, a latch can be used to indicate the result of a verify at the lower VL level, upon which the change from the first phase of the quick pass write, where the channel a selected element is held low, to the second phase, where the channel level is raised to slow programming.

In FIG. 17 the registers 434-i are labeled for the quick pass write of the lower page, which is implemented similarly to the case for a binary memory. The lower page original data is loaded along I/O line 231 to DL0 434-0, transferred into DL1 434-1 that serves for VH verify, and subsequently transferred into DLS 603 where it is used to determine whether the bit line is program enabled or inhibited. Latch DL2 434-2 is used for VL lockout.

Figure 18:
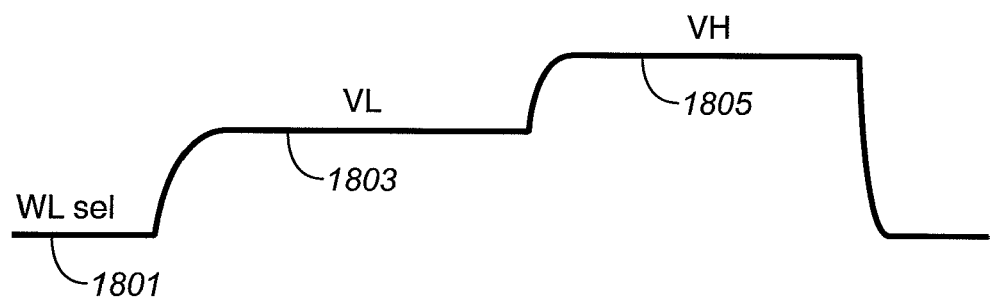
FIG. 18 shows an exemplary verify waveform to illustrate the two verify levels.

Program verify can be performed between programming pulses with a waveform such as shown in more detail in FIG. 18 applied to the selected word line WL 625. The waveform is raised from ground (1801) to the first, lower verify level VL (1803) and then further raised to the higher VH (1805). The other voltage levels on the array are at typical read values as described in the references incorporated above. This allows the two program verifies to be done consecutively according to the following steps:

(1) A first verify level uses the lower verify level VL (1803), with the data then being transferred to data latch DL2 434-2.

(2) The second verify is higher verify level performed when the verify waveform is at 1805. The result of VH will be transferred to data latch DL1 434-1. During the program pulse, the bit line bias setup will depend both of the VL and VH verify results.

(3) The VH verify result is transferred to SA data latch DLS 603 to charge bit lines to either 0 or Vdd.

(4) The VL verify result in NDL is transferred to SA data latch DLS 603 to charge bitlines from 0 to $V_{QPW}$ (if the cell verified), or to keep the bit line at 0 (if the data is "0"). The process is described in more detail in the flowchart of FIG. 19.

Figure 19:
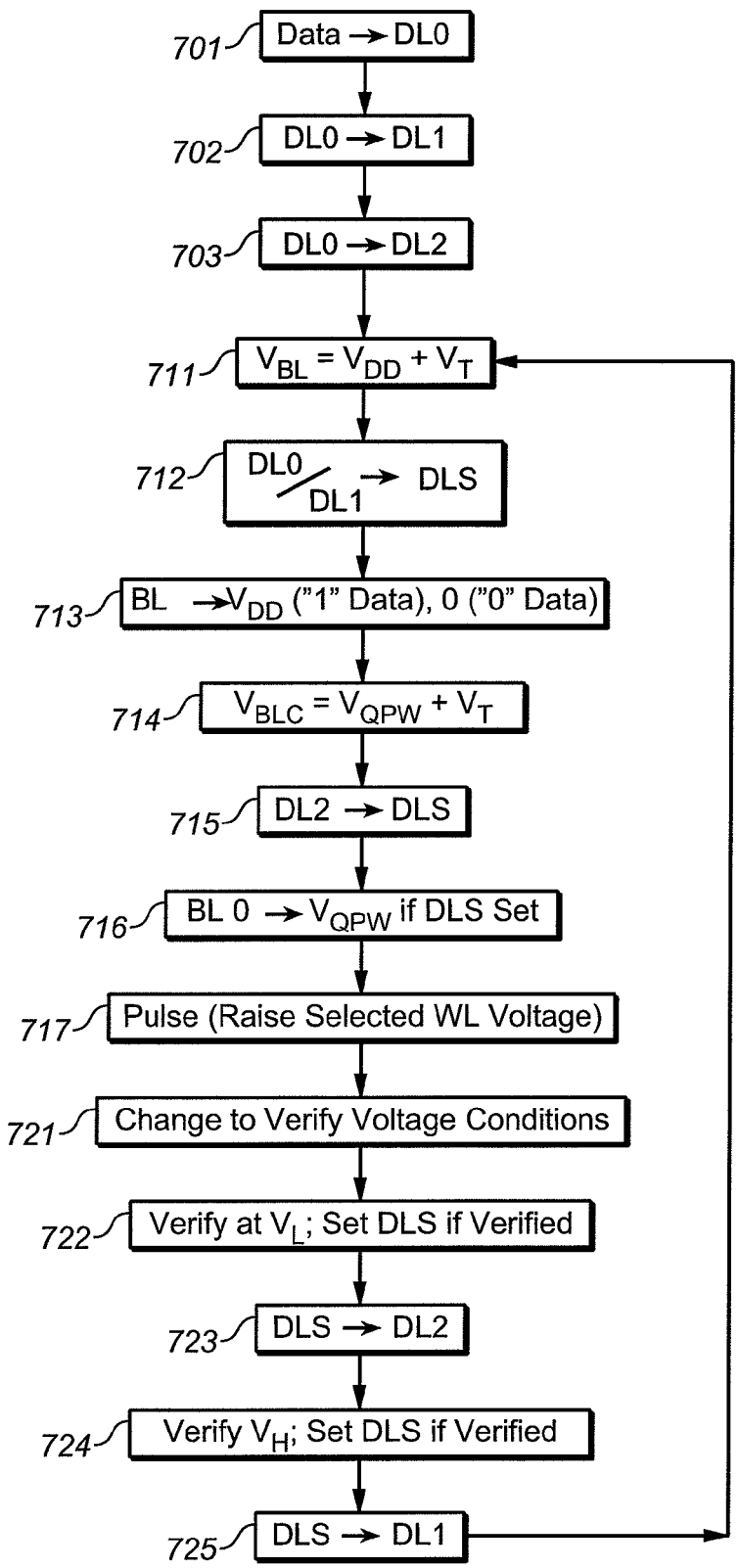
FIG. 19 is a flowchart for a quick pass write algorithm.

FIG. 19 is a flowchart of the program/verify sequence based on the latches of the read/write stacks of the exemplary all bit line embodiment. The initial condition of the data latches is established in steps 701-703, the program bias conditions are set and the program waveform is applied in steps 711-717, and the verify phase is in steps 721-725. The order here is that of an exemplary embodiment and order of many steps can be rearranged, as long as, for example, the correct bias levels are established before the world line is pulsed. In step 701 data is read in on line 231 into latch DL0 434-0 and subsequently transferred to latch DL1 434-1 in step 702. In step 703 it is further transferred into latch DL2 434-2. This sets the target data for the write process, where the convention used is that where a value of "0" corresponds to program and a value of "1" to program inhibit.

The programming phase begins by setting the correct bias conditions based on the latches. In step 711, the voltage to bit line clamp line is set at $V_{dd}+V_T$, the normal programming levels of the first phase of quick pass write, and, in step 712 the value held in latch DL0/DL1 is transferred to into latch DLS 603 of the sense amp, where a value of "0" (program) will result in the bit line held at ground and a value of "1" (inhibit) will effect a bit line value of $V_{dd}$. This (step 713) will set the voltage to the bit line clamp lines at $V_{dd}+VT$ so that the channels along the selected bit lines are held at ground for programming and the channels along the non-selected bit lines are left to float in order to inhibit programming. In step 714 the clamp voltage is lowered from $V_{BLC}=V_{dd}+V_T$ to $V_{BLC}=V_{QPW}+V_T$. The value in DL2 434-2, is transferred to sense amp data latch DLS 603 in step 715. In the first cycle through, this will be the initial value set in DL2. Once the cell verified at VL, the lowered $V_{BLC}$ value set in step 714 will then cause the bit line level to be raised from 0 to $V_{QPW}$ in the cells being programmed, thereby slowing the programming rate and transitioning to the second quick pass write phase.

In step 717, the programming pulse (QPW 1501, FIG. 15) is applied to the selected word line WL 625, the bias on the other lines having been established in the preceding steps. The inter-pulse verify phase begins at step 721 when the various bias voltages on are established prior to raising the selected word line to VL. In step 722, the word line's verify waveform raises to the lower margin VL (1803 FIG. 18) and, if the cell verifies, the latch in sense SA 601 trips and the value in DLS 603 switches from "0" to "1", the result then being transferred by the common processor 500 to DL2 434-2 in step 723. In step 724 the verify level is then raised to the higher margin VH (1805) and if the cell verifies DLS 603 is set, the result then being transferred by the common processor to DL1 434-1 in step 725.

The verify phase having been completed in steps 721-711, the common processor 500 needs to re-establish the bias conditions in the sense amp data latches for the subsequent pulse; unless, of course, all the cells being programmed lock out at VH or the program phase is otherwise terminated. This is done by looping back to step 711. In step 712, the VH verify result as indicated by the value now in DL1 434-1 is transferred; if the cell verified at VH, it will be program inhibited and the sense amp bit is changed form "0" to "1" to take the bit line high and inhibit further programming. The VL verify result, as now indicated by the value in DL2 434-2, is transferred to sense amp data latch DLS 603 in step 715; if the cell verified at VL, the bit line voltage is then raised in step 716.

The data latches being properly set, the next programming pulse is applied at step 717. The process then continues as before; alternately, the process could alter the verify waveform in FIG. 18, for example, and by eliminating the lower verify and steps 722 and 723 once it is no longer needed.

The preceding description has been for the lower page of an upper page/lower page arrangement, where each memory cell stores two bits of information, one corresponding to the upper page and one corresponding to the lower page. The process would proceed similarly to that already described for both the binary case and the first programmed page of other higher multi-page arrangements. The rest of the discussion will be also based on the two bit per cell, upper page/lower page embodiment as this illustrates the multi-state case while not adding unnecessary complications that the storage of more states would introduce. For multi-state memories using the multi-page format, a number of encodings of the pages onto the states of the cells are possible and several of these will be discussed for the exemplary upper page/lower page arrangement. Further detail of these different encoding, how they can be implemented, and their relative advantages are discussed in U.S. patent application entitled "Non-Volatile Memory and Method with Power-Saving Read and Program-Verify Operations" filed Mar. 16, 2005, incorporated by reference above.

Figure 20:
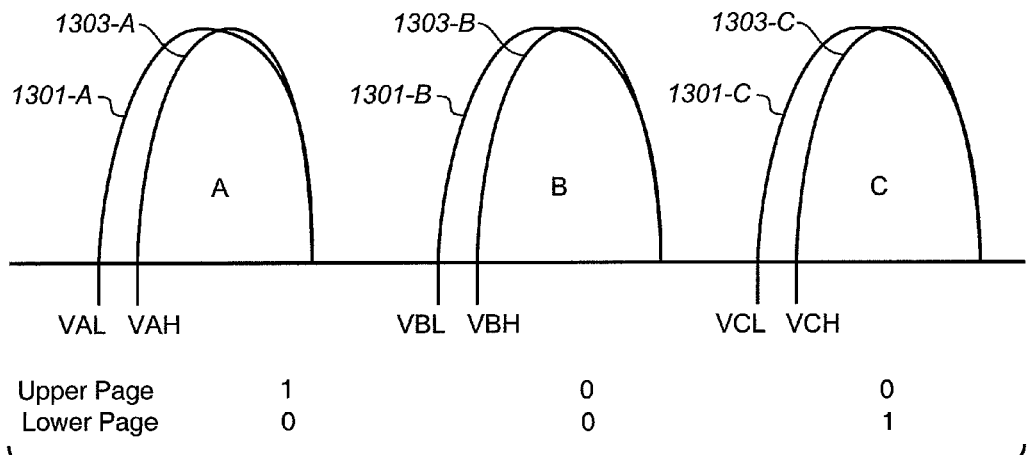
FIG. 20 shows a distribution of memory cells for a conventional two page coding.

The programming of the upper page of data using quick pass write is first described using "conventional code", where the upper page write is to program the B and C states, which then uses two program verify cycles. The state A was programmed in the lower page operation described in the preceding. The relation of the distributions for the A, B, and C states are shown in FIG. 20. The unprogrammed E distribution, corresponding to data "11", is not shown in this figure.

FIG. 20 shows a first distribution 1301 and a second distribution 1303 respectively corresponding to each state's lower verify VL, used in the first programming phase of the quick pass write, and higher verify VH, used in the second phase. The "conventional" coding of these programmed states into upper and lower page data is given under the distributions. In this coding, the states with lower page data "0" will have been programmed to the 1303-A distribution using the levels VAL and VAH in a quick pass write when the lower page was programmed as previously described. The upper page write is to program the B and C states.

Figure 21:
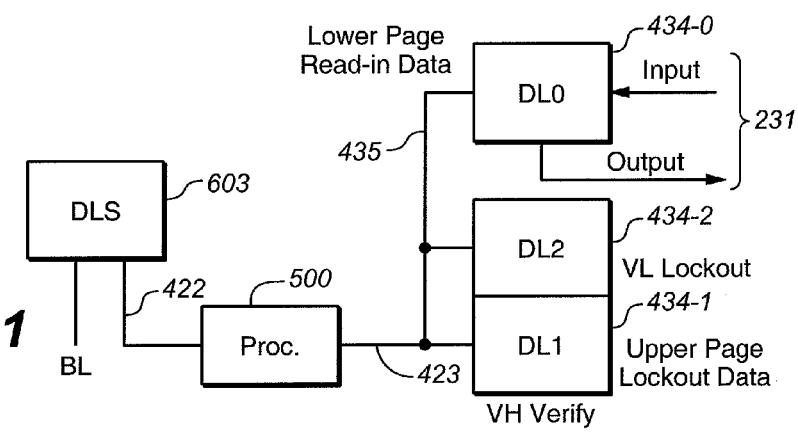
FIG. 21 describes the use of the data latches of FIG. 10 to implement quick pass write for an upper data page in conventional coding FIG. 22 describes the use of the data latches of FIG. 10 to implement quick pass write for full sequence programming.

The use of the data latches DL0-DL2 is described with respect to FIG. 21, which is similar to FIG. 17, but with the notation indicating the use of the different latches changed accordingly. As indicated there, the lower page data is read in to DL0 434-0, DL1 434-1 is used for the upper page lockout data and will receive the VH verify result, and DL2 434-2 is again used to hold the VL lockout data. As with the lower page write, one latch is assigned for each of the two verify levels, with DL1 for the actual, higher verify result and DL2 for the lower verify result used to effect the phase transition of the quick pass write.

More specifically, the VL lockout information will be accumulated in data latch DL2 434-2, with its initial value again transferred in from DL1 434-1 and corresponding to the original program data to indicate if the cell is to undergo upper page programming. In the present embodiment, the bit line bias for the B and C state's quick pass write is the same; in a variation, additional latches can be introduced to allow the B and C states to employ different bias levels. Also, VL lockout information is only used for temporary storage. The data in the data latch DL2 434-2 for VL will be changed from "0" to "1" after passing each VL verify sensing. The logic is such that it will not allow a "1" value to flip back to "0" during a given programming run.

The VH lockout is also accumulated through many different verify sensing. As soon as the bits passed verify level of its intended program state, the data in the data latch will be changed to "11". For example, if the B state passed verify VBH, then the data in data latch "00" will be changed to "11". If the C state passed verify VCH, then the data in data latch "01" will be changed to "11". The logic is such that it will not allow a "1" value to flip back to "0" during a given programming run. Note that for upper page programming, VH lockout may occur based on only one data latch.

U.S. patent application Ser. No. 11/013,125 filed Dec. 14, 2004, describes a method where the programming of multiple pages held by the same set of multi-state memory elements can be overlapped. For example, if while writing a lower page the data for the corresponding upper becomes available, rather than wait for the lower page to finish before beginning to program the upper page, the write operation can switch to a full programming sequence where the upper and lower pages are programmed concurrently into the physical page. The quick pass write technique can also be applied to the full sequence operation.

Figure 22:
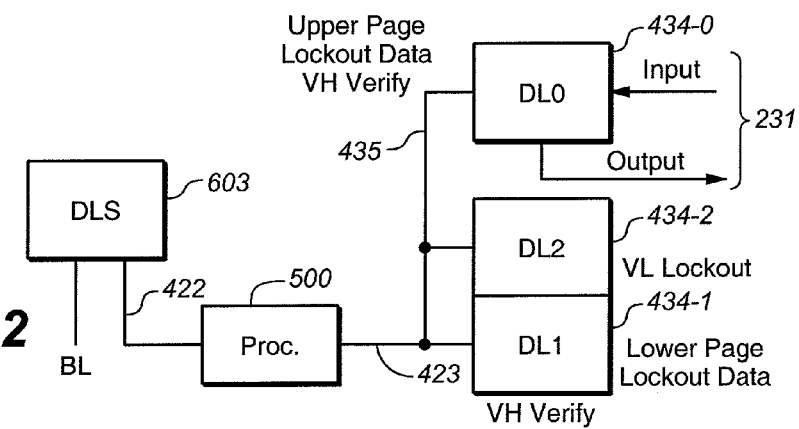

FIG. 22 shows the use of the data latches DL0-DL2 for the full sequence write and is similar to FIG. 17, but with the notation indicating the use of the different latches changed accordingly. As shown there DL0 434-0 is used for the upper page lockout data and will receive the corresponding VH verify result, DL1 434-1 is used for the lower page lockout data and will receive the corresponding VH verify result, and DL2 434-2 is again used to hold the VL lockout data. Unlike in single page programming, where the initial DL2 434-2 value corresponds to the initial program data, the initial value at the time of the full sequence transition will account for the upper and lower page data. Consequently, rather than also just loading the appropriate, single page original program data into DL2 434-2, it is now only set to "1" if both of the latches DL0 and DL1 are "1".

In an exemplary embodiment, the full sequence operation with quick pass write can include the following steps:

(1) The first page data is loaded into latch DL0 434-0 and the lower page can start programming as described above.

(2) As described above for lower page programming, one the lower page program data has been transferred to latch DL1 434-1, latch DL0 434-0 can be reset and be ready to sequentially load another page, allowing the upper page on the same word line WL 625 to transferred in when available.

(3) After the upper page data is finished loading, the programming of the lower page will likely not be done. In this case, the program algorithm can be converted to program two bits at the same time, according to the full sequence programming described in U.S. patent application Ser. No. 11/013, 125, to accelerate the program speed. If upper page data was not available or otherwise not loaded prior to the writing of the page being completed, the upper page will be programmed by itself as described above.

(4) Before the conversion form lower page program to full sequence conversion, the lower page original data may have been locked out to "11" for cells that passed program verify A. These data should be read at the A level to recover their original data, since the two-bit full sequence write needs both the lower and the upper page data to program.

(5) In this two-bit full sequence program algorithm, the program verifies for the A, B, and C states can be performed at the same time or separately. The lockout process can also lockout the both latches at the same time.

(6) After program data A and B are finished, only the C state remains to be programmed so that the process resembles a binary write. The remaining program data can be transferred to DL1, allowing DL-0 to be reset to "1" for the next page of data to be loaded.

Figure 23:
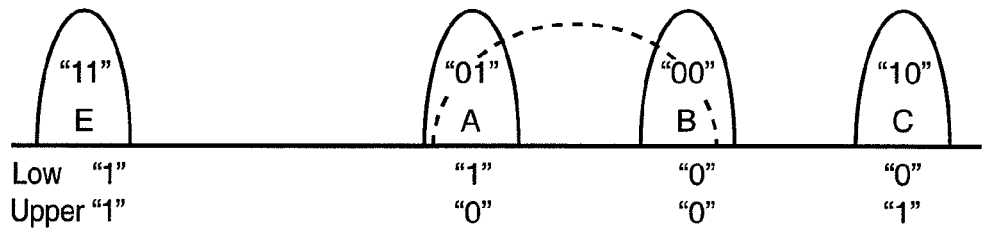
FIGS. 23 and 24 shows a distribution of memory cells for alternate two page codings.
Figure 24:
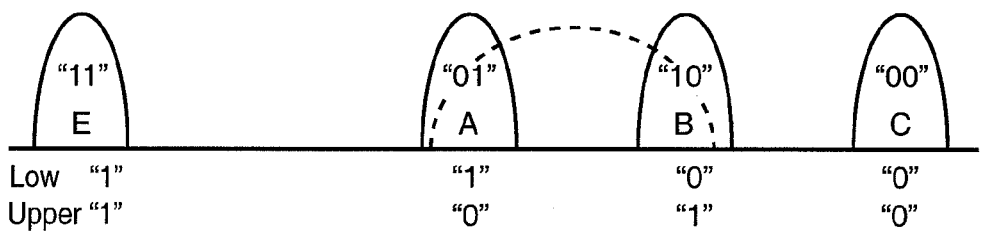

The preceding discussion of upper page programming using quick pass write was based on the conventional encoding of the states E, A, B, and C into upper and lower pages, as is shown in FIG. 20. As developed more in U.S. patent application entitled "Non-Volatile Memory and Method with Power-Saving Read and Program-Verify Operations" filed Mar. 16, 2005, other encodings are often useful. Two examples are shown in FIGS. 23 and 24, the first of these showing the "LM old" code and the second showing the "LM new" code. In both cases, the broken line indicates an intermediate state's distribution that is the result of the lower page program, with the lower page write using quick pass write in both LM codes done similarly to the lower page program described above. The upper page program then moves cells from the intermediate distribution to a final target state of either the B or C distribution and programs cells with "01" data from the "11" state's E distribution into the A distribution. The upper page write using quick pass write in both LM codes is done similarly to the upper page program described above for the conventional code, the difference being that lower page will also lockout as the state B and state C are coming from intermediate state (dotted line).

For both versions of the LM code, quick pass write is done in the same way, but with the verification of states switched so that B_new=C_old and B old=C_ new due to the differing assignment of the two bits to the four states. This change, as with the change from the conventional coding, is effected by the common processor 500. The data transfer The data transfer logic through common processor 500 will depend on the code and therefore it will be different.

The upper page program algorithm for the LM codes is also similar to the full sequence quick pass write algorithm in that both VH lockout data are updated after the VH verify. For the LM old code, the upper page is also the same as in the conventional code if the lower and upper page are codes are switched, in which case the upper page in the LM old code is the same as full sequence program.

Figure 25:
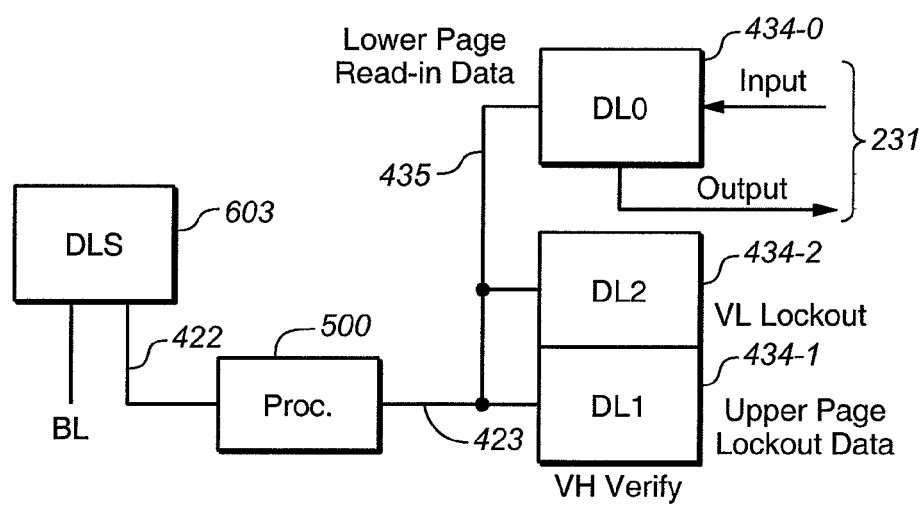
FIG. 25 describes the use of the data latches of FIG. 10 to implement quick pass write for an upper data page in alternate two page codings.

FIG. 25 again shows the data latches and their assignment for the LM codes in a manner similar to FIG. 22 and other similar figures above. Lower page data is read into DL0 434-0, the upper page lockout data based on VH is held in DL1 434-1, and DL2 434-2 is again assigned the VL lockout data used to control the phase shift for the quick pass write technique.

As there is no additionally state above the C state, the situation is similar to the binary case in that the important outcome is that the C distribution is sufficiently well defined from the distribution below it, but over-programming is not a major concern (at least as far as state determination). Consequently, it may be preferred to use the quick pass write for the A and B states, but not for the C state, instead using only the VH level of this state. (For memories having other numbers of states, these comments apply to the highest lying, or rather most programmed, state.)

For example if all three states are using quick pass write, the implementation of the program and verify is often simpler that they are done in the same way for all three states; however, since the C state distribution can be wide and still have acceptable margins, quick pass write can be omitted for the C state in order to reduce programming time.

As noted, using quick pass write (QPW) for the lower states but not using quick pass write for the C state can complicate the programming algorithms. For example, at certain point of the write process, a program pulse is followed by verify A (with QPW), verify B (with QPW), and verify C (no QPW), which is then followed by another program pulse. Since the quick pass write algorithm describe above uses two data transfers for program pulse (a first data transfer to lockout VH and a second data transfer to lockout VL), the first data transfer will have no problems for all three states; but the second transfer will, under the above arrangements, result in a program error for state C. Since state C will not do verify VCL at the lower level, then the DL2 434-2 data latch is not updated for this bit line. If this bit line needs to be locked out after passing the high VCH verify level for C, the VH lockout data latch will transfer "1" to the SA data latch for program inhibit after the first data transfer. However, the VL data latch (DL2 434-2) will still hold data since there is no verify result to update it. Therefore, the second data transfer will transfer a "0" to the DLS 603 of the bit line. This would result in the pre-charged bit line being discharged to 0, causing this bit line to over-program.

To overcome this problem, when quick pass write is not being used for the C state, the algorithm is modified by updating the VL data latch (DL2 434-2) with a C verify at the high level of VCH. Thus, if the cell passes verify for the C level at VCH, then both VH and VL lockout data will be changed to "1" and programming will be inhibited. Also, if the both the A and B states are finished writing while the C state is not, the program algorithm can switch to standard programming with no quick pass write, or noQPW algorithm, as only the C state is left and it will only use the corresponding VH verify level. In this case, only a single data transfer (of the VH level, the VL level not being used) will be done.

Although the various aspects of the present invention have been described with respect to certain embodiments, it is understood that the invention is entitled to protection within the full scope of the appended claims.

What is claimed is:

1. A method of performing a programming operation in a non-volatile memory device having one or more memory cells each capable of storing N bits of data, where N is greater than or equal to one, and read/write circuitry connectable to the memory cells, the read/write circuitry including programming circuitry, bias circuitry to set bias conditions in the memory cells and one or more sets of latches each associated with a corresponding one of the memory cells to which the read/write circuitry is connected, the method comprising:
   applying a monotonically non-decreasing programming waveform from the programming circuitry to the memory cells;
   concurrently with applying said programming waveform, setting bias conditions in the memory cells by said bias circuitry, wherein a first set of bias conditions is used during a first programming phase and a second set of bias conditions is used during a second programming phase; and
   governing which of the programming phases is active by a first latch of each of said sets of latches.

2. The method of claim 1, wherein setting bias conditions during the first programming phase includes setting to ground the channel of selected memory cells and wherein setting bias conditions during the during the second programming phase includes allowing the channel of the selected memory cells to be at a higher voltage than during the first phase.

3. The method of claim 1, wherein the number of latches in each of said sets of latches is N+1.

4. The method of claim 3, wherein the N latches other than the first latch in each of said sets of latches is used to hold data to be programmed into the corresponding memory cell.

5. The method of claim 4, further comprising initializing the first memory latches based on the data to be programmed into the corresponding memory cell.

6. The method of claim 1, wherein the read/write circuitry further includes sense circuitry, the method further comprising:

performing a verify operation by sense circuitry for one or more of said N bits of data for selected ones of the memory cells during the course of the program operation, wherein the verify operation for at least one of said bits of data includes:

verifying at a first level; and verifying at a second, higher level, the result of the verify at the first level being stored in the first latch for governing of the programming phase.

7. The method of claim 6, wherein the number of latches in each of said sets of latches is N+1.

8. The method of claim 7, further including:

holding in the N latches other than the first latch in each of said sets of latches data to be programmed into the corresponding memory cell.

9. The method of claim 8, wherein the value of the latches used to hold data to be programmed into the corresponding memory cell are updated based on the result of the verify at the second level for the corresponding memory cell.

10. The method of claim 6, wherein N is greater than one and the verify for at least one of said bits of data includes a verify at only a single level.

11. The method of claim 1, wherein said one or more memory cells is a plurality formed into an array along a plurality of bit lines and a plurality of word lines, and wherein during the programming operation a plurality of selected memory cells are programmed concurrently by said waveform being applied to a selected word line.

12. The method of claim 11, where each of said selected memory cells is connectable along one of the bit lines to the corresponding set of latches, each of the sets of latches including the first latch that governs which of the programming phases is active.

13. The method of claim 12, further including:

changing from the first programming phase to the second programming phase by changing the bias level on the bit lines.

14. The method of claim 13, where the memory cells are connectable along one of the bit lines to the corresponding set of latches though a corresponding clamp element, the clamp elements being commonly controlled, and wherein the changing of the bias on the bit lines from the first programming phase to the second programming phase is effected by controlling the clamp elements.

15. The method of claim 11, where the memory device has a NAND-type architecture.

16. The method of claim 15, where the memory device has a NAND-type architecture using an all bit line arrangement.

17. The method of claim 15, wherein N equals two and data is stored according to a lower page/upper page format.

* * * * *